(12) United States Patent
Hegde

(10) Patent No.: US 6,543,522 B1
(45) Date of Patent: Apr. 8, 2003

(54) ARRAYED FIN COOLER

(75) Inventor: Shankar Hegde, Annassandrapalya Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/999,562

(22) Filed: Oct. 31, 2001

(51) Int. Cl.[7] .............................. F28F 7/00; F24H 3/02; H05K 7/20

(52) U.S. Cl. ...................... 165/80.3; 165/185; 361/695; 361/697; 174/16.3

(58) Field of Search ............................... 165/80.3, 185, 165/121; 361/695, 690, 697; 174/16.3

(56) References Cited

U.S. PATENT DOCUMENTS 5,661,638 A * 8/1997 Mira ........................ 361/697
6,134,108 A * 10/2000 Patel et al. ................. 361/695
6,401,808 B1 * 6/2002 Hanzlik et al. .............. 165/121
6,404,634 B1 * 6/2002 Mann ........................ 165/80.3
6,452,803 B1 * 9/2002 Liu ............................ 361/695
6,466,444 B2 * 10/2002 Cheung .................... 165/80.3

* cited by examiner

*Primary Examiner*—Henry Bennett
*Assistant Examiner*—Tho V Duong
(74) *Attorney, Agent, or Firm*—Trueman H. Denny, III

(57) ABSTRACT

An arrayed fin cooling system for removing waste heat from a component is disclosed. The arrayed fin cooling system includes plurality of discrete cooling fins that act as individual heat sinks. The cooling fins are arranged in a radial array so that the cooling fins diverge from one another to define an air path between adjacent cooling fins. Each cooling fin includes a base that is adapted to connect with a surface of the component to be cooled. Waste heat is transferred from the component to the cooling fin via the base. The cooling fins are surrounded at an outer edge by a radial shield that channels an air flow over the cooling fins to maximize the amount of air that passes over the cooling fins. The cooling fins can be manufactured at a low cost using processes such as stamping and forging.

17 Claims, 26 Drawing Sheets

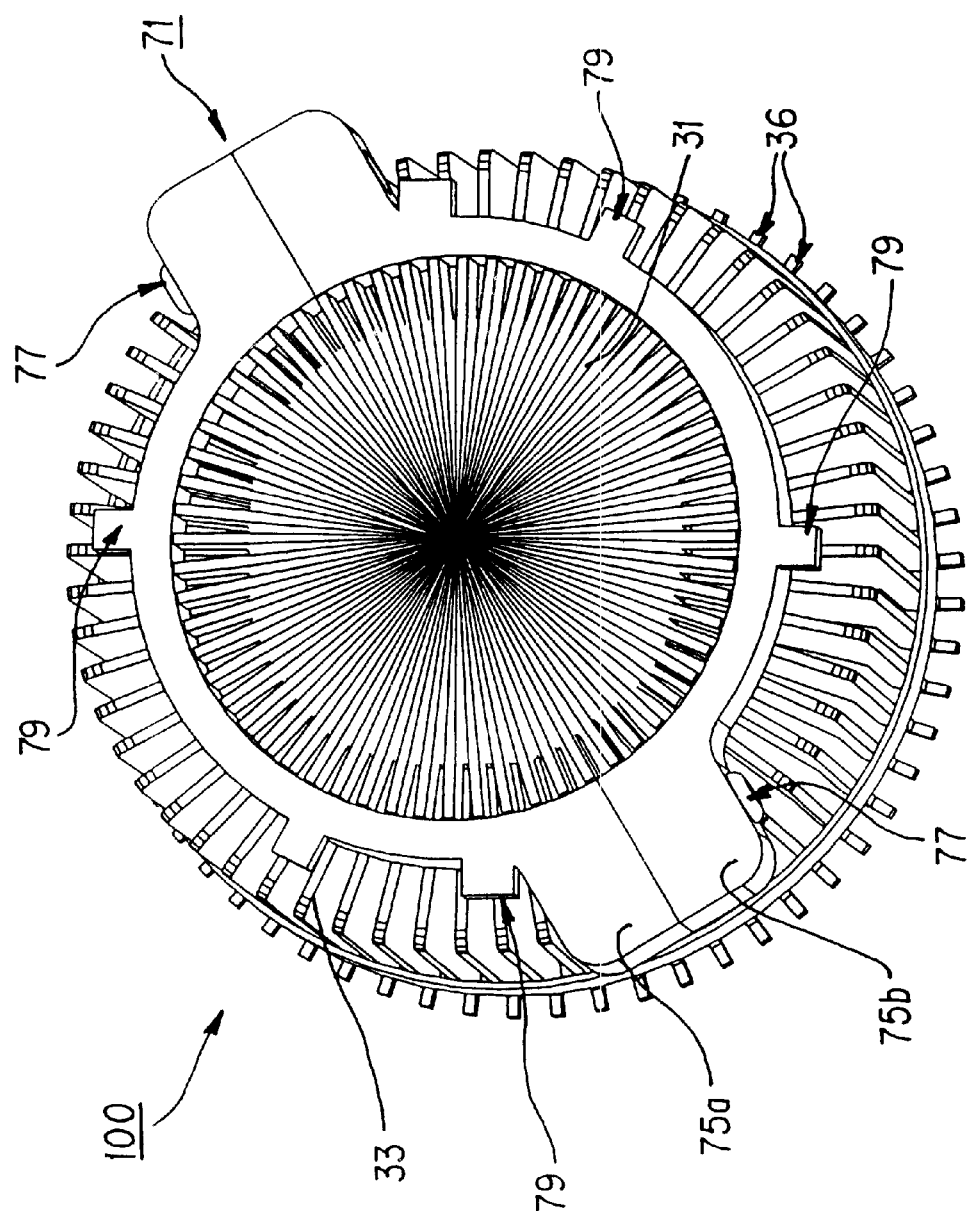

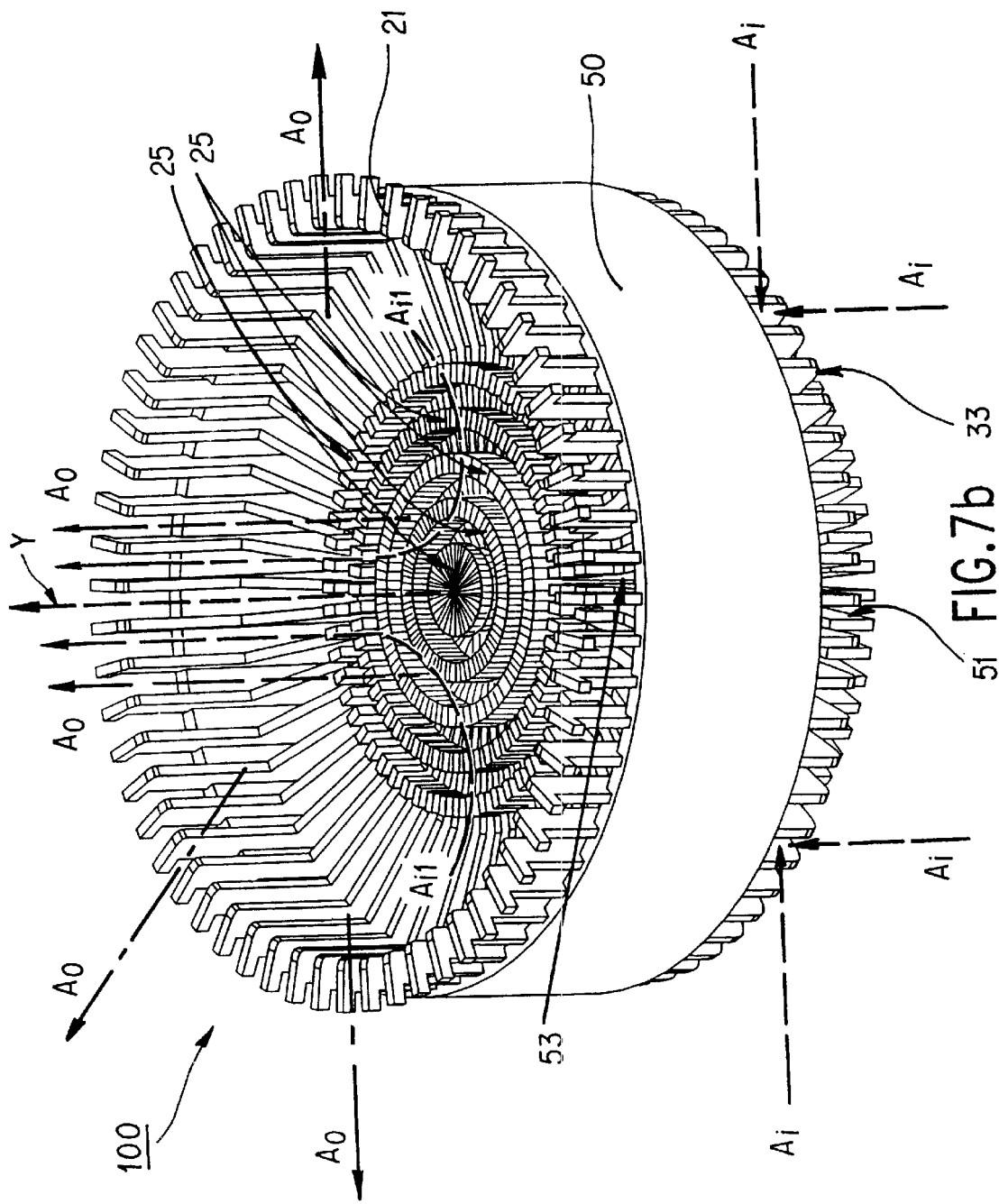

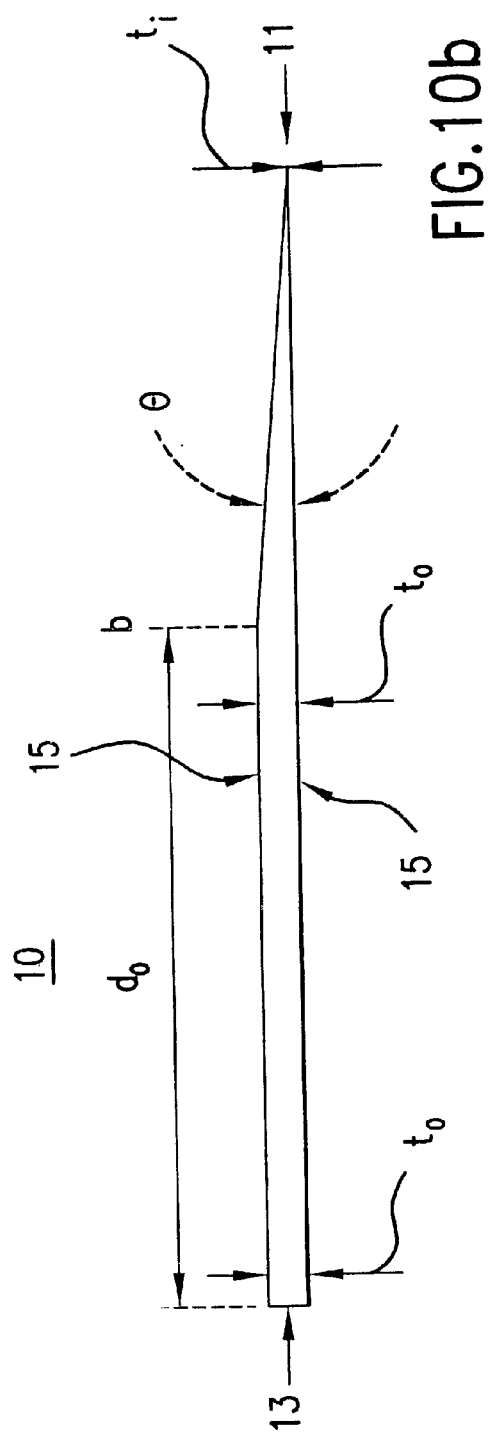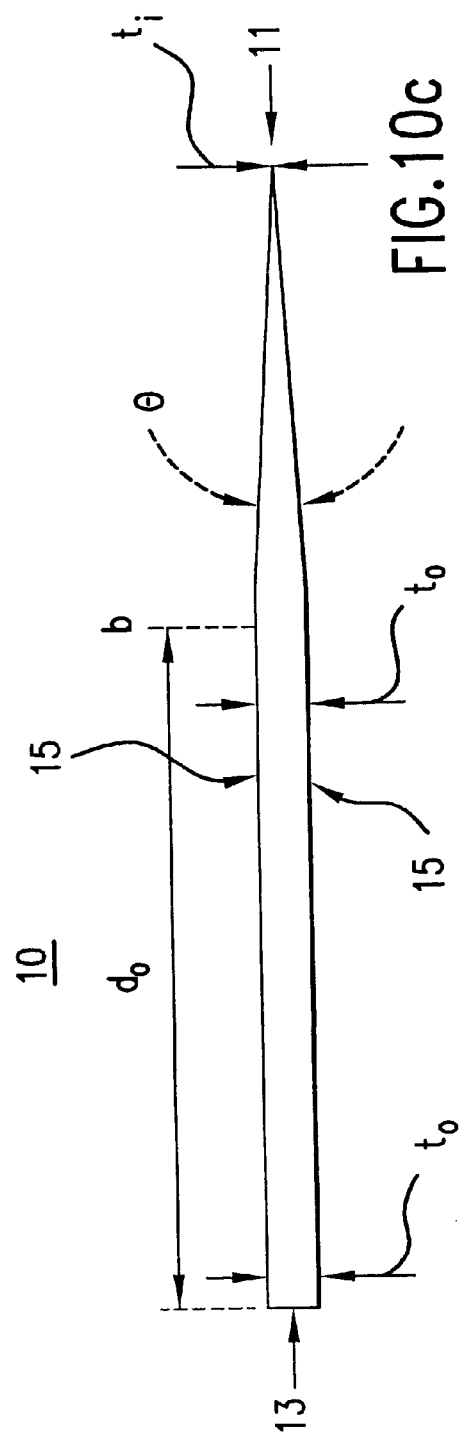

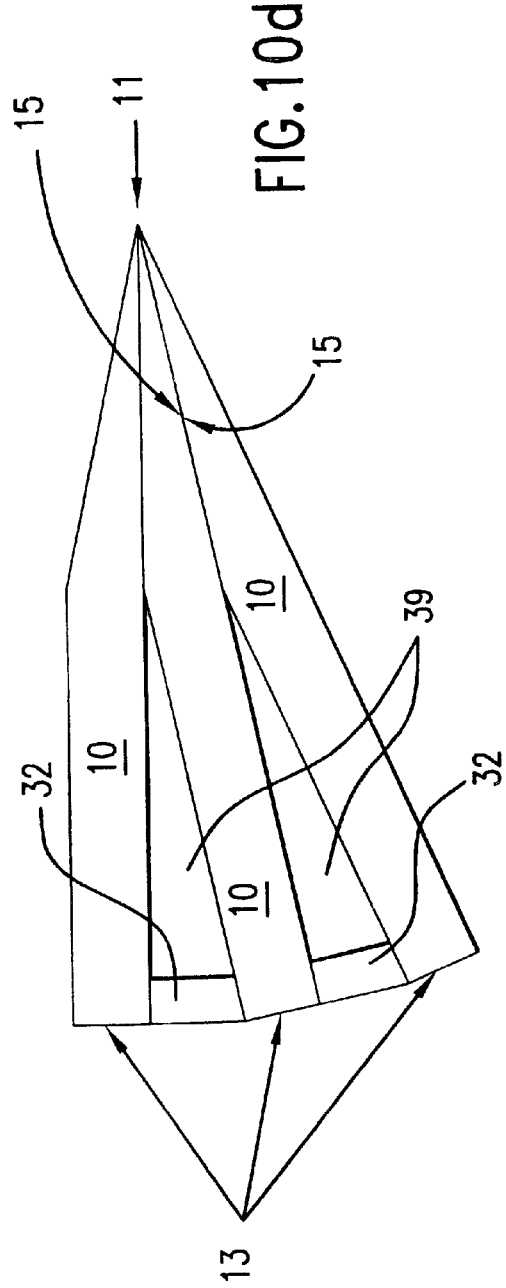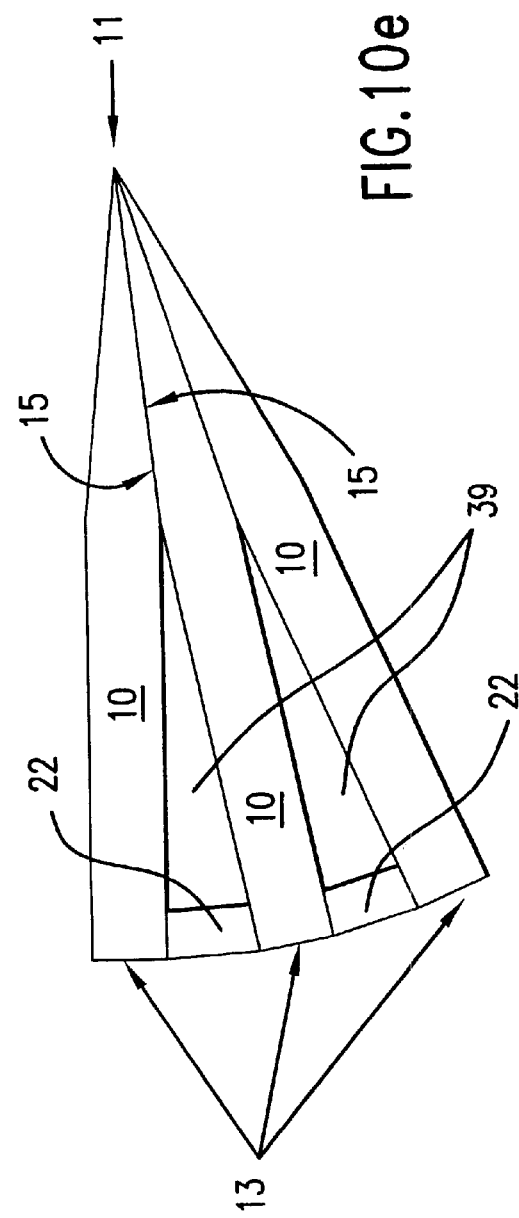

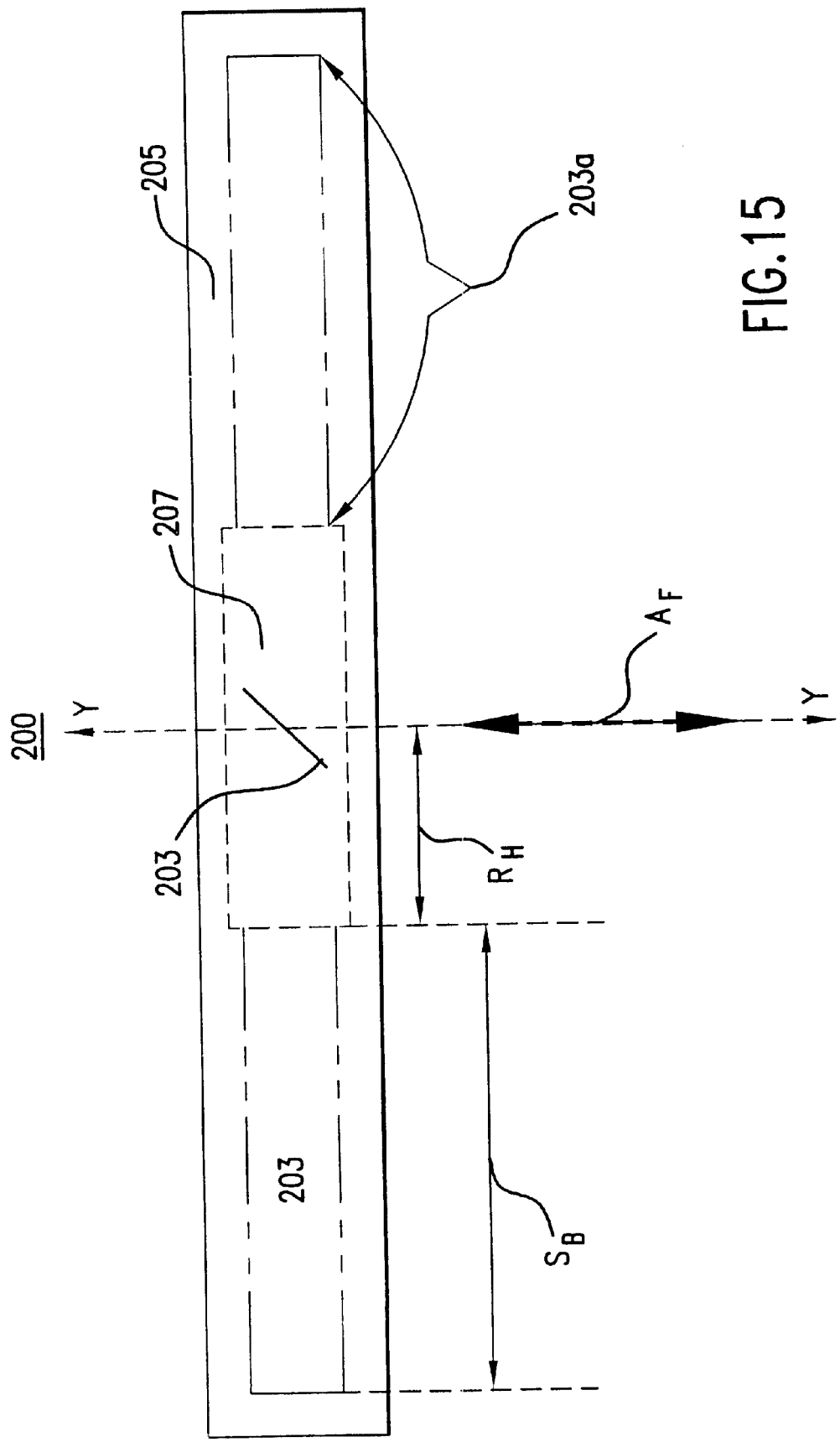

ARRAYED FIN COOLER

FIELD OF THE INVENTION

The present invention relates generally to an arrayed fin cooling system for removing heat from a component. More specifically, the present invention relates to an arrayed fin cooling system that includes a plurality of discrete cooling fins arranged in a radial array and with each of the cooling fins serving as a heat sink, so that collectively, the cooling fins efficiently remove heat from the component.

BACKGROUND OF THE INVENTION

It is well known in the electronics art to place a heat sink in contact with an electronic device so that waste heat generated by operation of the electronic device is thermally transferred into the heat sink thereby cooling the electronic device. With the advent of high clock speed electronic devices such as microprocessors ($\mu$P), digital signal processors (DSP), and application specific integrated circuits (ASIC), the amount of waste heat generated by those devices and the operating temperature of those devices are directly proportional to clock speed. Therefore, higher clock speeds result in increased waste heat generation which in turn increases the operating temperature of the device. However, efficient operation of the device requires that waste heat be effectively removed.

Heat sink devices came into common use as a preferred means for dissipating waste heat from electronic devices such as the types described above. In a typical application, a component to be cooled is carried by a connector that is mounted on a PC board. Efficient dissipation of heat from the component by the heat sink depends to a large extent on the thermal contact between the heat sink and the component and the contact pressure between the heat sink and the component. Ideally, an attachment device, such as a clip or the like, positions the heat sink so that the a surface of the heat sink is in contact with the component and so that the contact pressure between the heat sink and component acts along a load axis that is centered on the component. Additionally, a fan is usually used to generate an air flow through the heat sink so that waste heat in the heat sink is thermally transferred from the heat sink to the air flow.

Heat sinks that are currently available on the market are manufactured using prior machining processes that include extrusion, impact forging, and vacuum brazing. A few heat sinks are produced using a die casting process. However, it is difficult to produce a high performance heat sink using the die casting process. The objective of all of those prior machining processes is to produce a heat sink having a plurality of fins that are connected with a heat mass and that provide an air flow path over the fins that will remove waste heat from the fins and the heat mass.

All of the aforementioned prior machining processes have their own limitations on a Length to Breadth ratio (L/B) on a fin gap between adjacent fins on the heat sink. Generally, in extruded heat sinks, efficiency depends on the number of fins that can formed in a given area. To increase that area within a given volume, the L/B ratio must be increased. Typically, the area is increased by decreasing the fin gap between adjacent fins (i.e. B is reduced) and by increasing a height of the fins (i.e. L is increased). However, the extrusion process has limitations on the L/B ratio. That L/B ratio limitation paved a path for heat sinks to grow in size in a X-direction and a Y-direction in order to cater to the high performance cooling needs of the above mentioned high clock speed electronic devices.

One disadvantage to the prior machining processes is that a slit width that is used to form an air gap between adjacent fins is parallel due to slitting wheels that are used to machine the slits. As a result, a cross-sectional area of the fin is reduced in a direction towards a center of the heat mass of the heat sink.

A second and related disadvantage to the prior machining processes is that a fin depth is reduced with a subsequent reduction in a surface area of the fin that is available to transfer the waste heat to the air flow over the fin.

A third disadvantage is that the number of fins that can be cut into the heat mass is reduced. Therefore, there are fewer fins available to transfer the waste heat from the fins to the air flow.

Finally, the prior machining processes can be complicated and can require several machining steps that increase the cost of producing the heat sink. There are many applications that use high clock speed electronic devices that also require a low cost heat sink.

Consequently, there is a need for a heat sink that can be manufactured at a low cost and without complex and time consuming machining processes. There is also a need for a heat sink that can accommodate a large number of fins having a large surface area. Additionally, there exists a need for a heat sink with deep fins that have a large cross-sectional area at the heat mass.

SUMMARY OF THE INVENTION

The arrayed fin cooling system of the present invention solves the aforementioned problems. The problems associated with manufacturing costs and complexity are solved by using a plurality of discrete cooling fins to form an arrayed fin cooling system. The discrete cooling fins can be manufactured at a low cost using a process such as stamping, for example.

The problems associated with fin surface area and the number of fins are solved by the discrete cooling fins because each cooling fin acts as a discrete heat sink and the area of the fin can be made as large as is necessary for the intended application. The number of cooling fins can be increased by decreasing a thickness of each cooling fin.

Because the cooling fins define a heat mass of the arrayed fin cooling system, a depth of the cooling fins is not limited by the machining processes used to form the cooling fins. Therefore, the problems associated with the fins having a larger cross-section area at the heat mass are solved by the using the discrete cooling fins of the present invention.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 6a and 6b are a bottom view and a bottom profile view respectively of a base ring after connection with an arrayed fin cooling system according to the present invention.

FIGS. 7a and 7b depict an air inflow and an air outflow through an arrayed fin cooling system according to the present invention.

FIGS. 10a through 10c depict variations in thickness of a discrete cooling fin according to the present invention.

FIGS. 10d and 10e depict a cross-sectional profile of a discrete cooling fin and an equidistance spacing between a plurality of cooling fins according to the present invention.

FIG. 15 is a cross-sectional view illustrating a hub radius of a fan according to the present invention.

DETAILED DESCRIPTION

Figure 1:
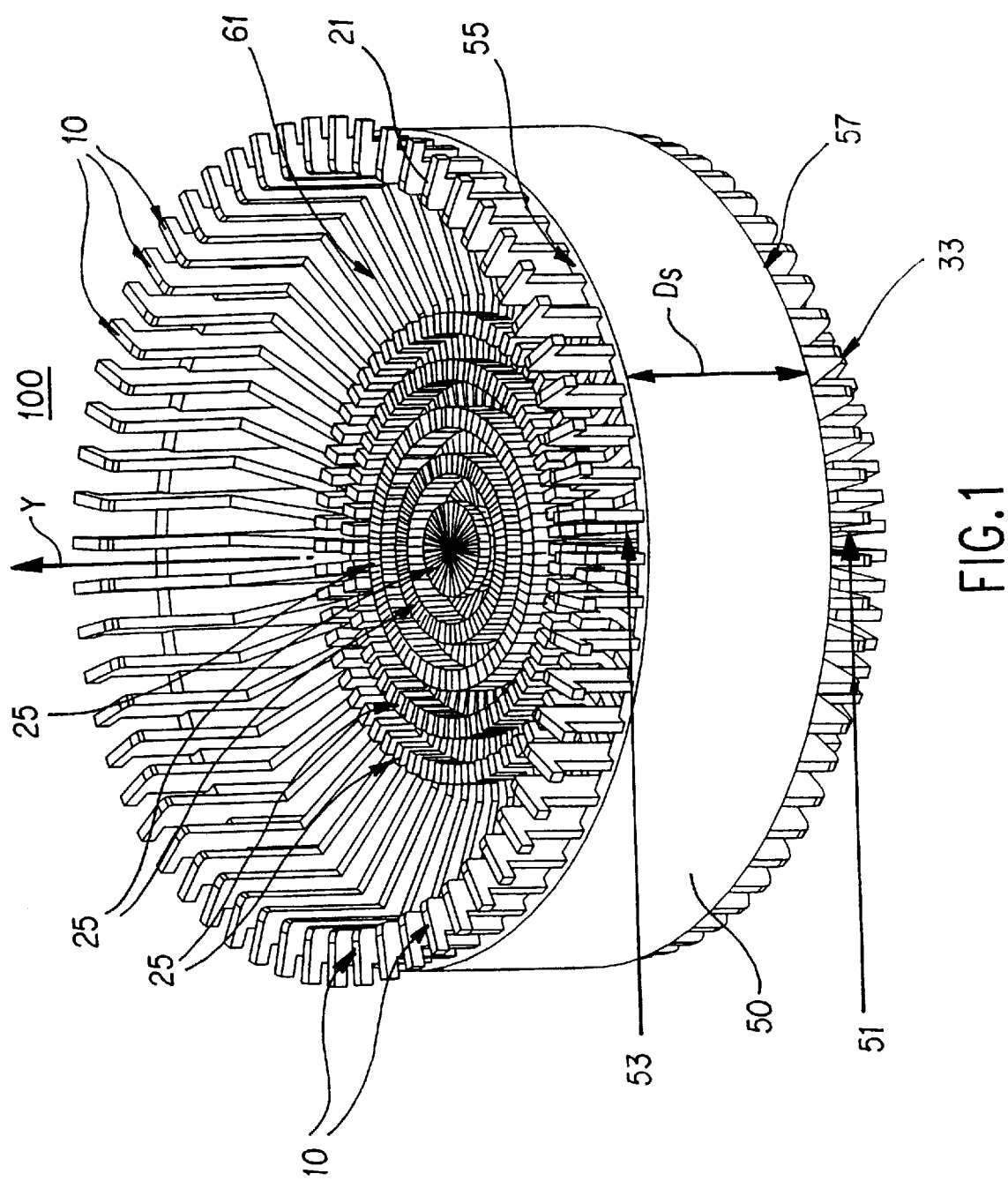
FIG. 1 is a top profile view of an arrayed fin cooling system according to the present invention.

In the following detailed description and in the several figures of the drawings, like elements are identified with like reference numerals.

As shown in the drawings for purpose of illustration, the present invention is embodied in an arrayed fin cooling system for removing heat from a component. The arrayed fin cooling system includes a plurality of discrete cooling fins. That is, the arrayed fin cooling system comprises a plurality of individual cooling fins that are combined to form the arrayed fin cooling system.

Each discrete cooling fin includes an inner edge, an outer edge, and cooling surfaces that are positioned in opposition to each other and that are spaced apart by a distance that decreases from the outer edge to the inner edge. Each discrete cooling fin also includes a leading edge and a trailing edge. The cooling fins are arranged in a radial array with the fins connected with one another along a portion of their respective cooling surfaces that are proximate their respective inner edges. The cooling fins diverge from one another in a radially outward direction so that an air path is defined between adjacent cooling fins.

The trailing edge of each cooling fin includes a radial fin, a first aerodynamically profiled surface, and a plurality of spaced apart cooling projections. The cooling projections are positioned between the first aerodynamically profiled surface and the inner edge of the cooling fin.

The leading edge of each cooling fin includes a base, a second aerodynamically profiled surface, and a slot that is positioned between the base and the second aerodynamically profiled surface. The base is placed into contact with the component to be cooled so that heat is transferred from the component to the cooling fin.

The arrayed fin cooling system also includes a base ring. The base ring includes a collar profile that complements the slot on the cooling fins. The collar profile is connected with the slot of each cooling fin and retains the cooling fins in fixed relation to one another.

A radial shield is in contact with a portion of the outer edges of all the cooling fins. The radial shield includes an upper edge and a lower edge that are separated from each other by a distance. The radial shield defines an air inlet between the lower edge and the second aerodynamically profiled surface and defines an air outlet between the upper edge and the radial fin.

Heat is removed from the component by an air inflow through the air inlet. The radial shield channels the air inflow through the air path and over the cooling surfaces of the cooling fins. A portion of the air inflow is redirected over the cooling projections by the first aerodynamically profiled surface. The radial shield also channels the air inflow into an air outflow that exits through the air outlet and along an axis that is substantially parallel with the inner edges of the cooling fins.

Figure 2:
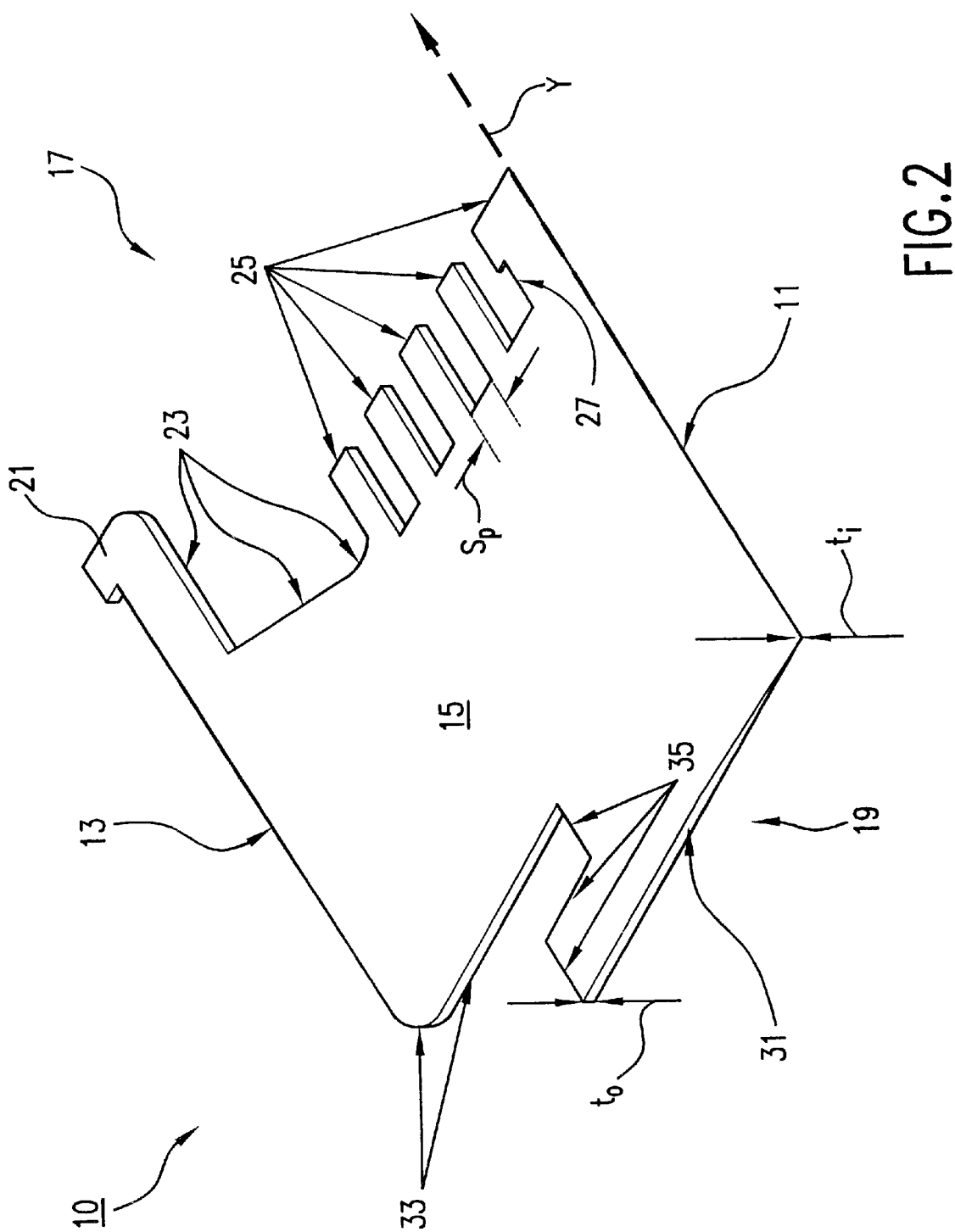
FIG. 2 is a profile view of a discrete cooling fin according to the present invention.
Figure 3:
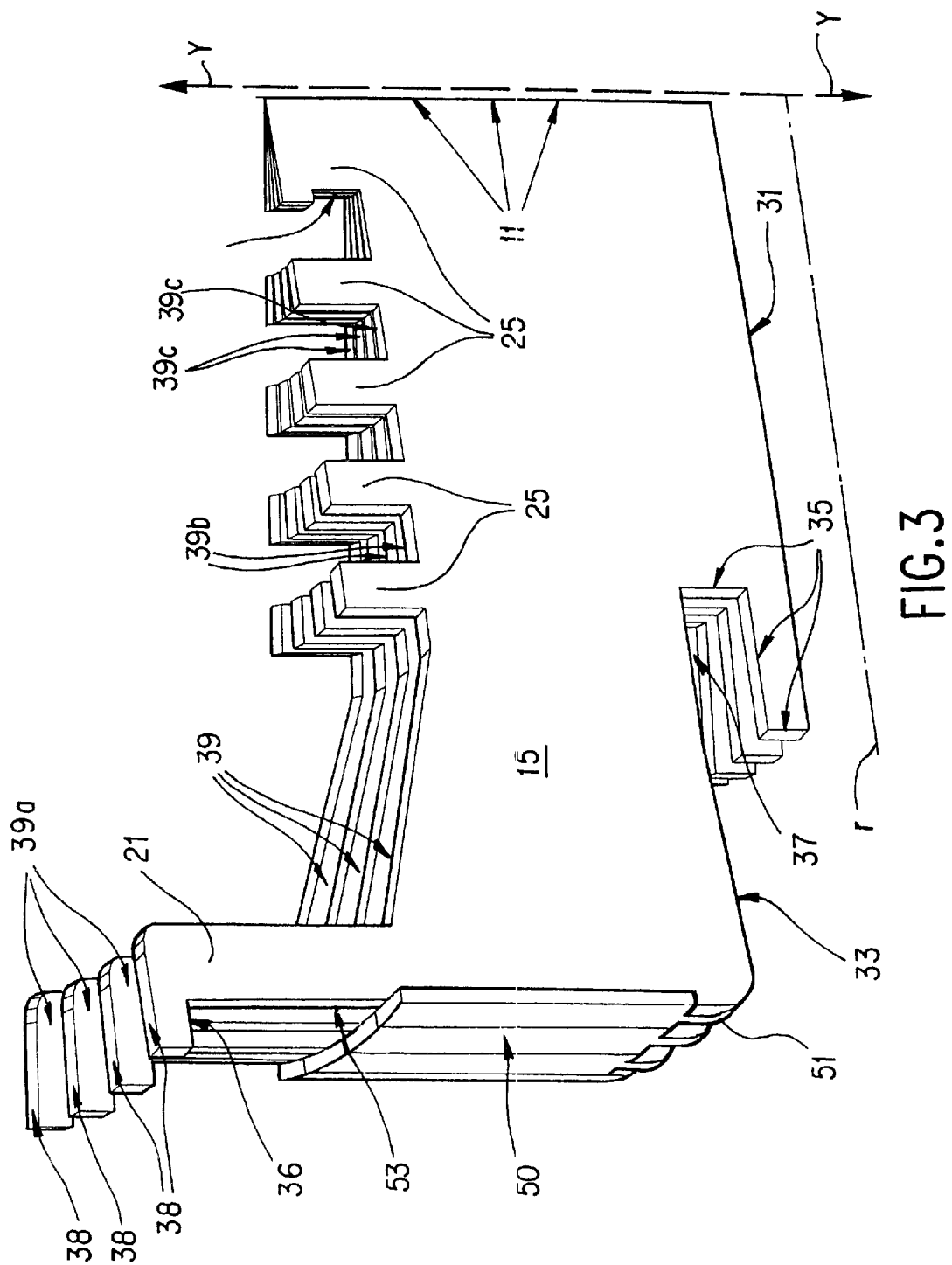
FIG. 3 is a profile view of a plurality of discrete cooling fins according to the present invention.

In FIGS. 1, 2 and 3, an arrayed fin cooling system 100 for removing heat from a component (not shown) includes a plurality of discrete cooling fins 10. In FIG. 2, each cooling fin 10 includes an inner edge 11, an outer edge 13, and cooling surfaces 15 that are positioned in opposition to each other. The cooling surfaces 15 are spaced apart from each other by a distance that decreases from the outer edge 13 to the inner edge 11 as illustrated by a distance to at the outer edge 13 and a distance $t_i$ at the inner edge 11 (i.e. $t_O > t_i$). Each cooling fin 10 further includes a leading edge 19 and a trailing edge 17. In FIG. 3, the cooling fins 10 are connected with one another along a portion of their cooling surfaces 15 with their inner edges 11 positioned proximate to one another. The cooling fins 10 diverge from one another in a radially outward direction r to define an air path 39 between adjacent cooling fins 10. In FIG. 3, the air path 39 is narrower in a direction towards the inner edge 11 as indicated by arrows 39b and 39c and is wider in a direction away from the inner edge 11 as indicated by arrows 39a. FIG. 3 illustrates a sector of the cooling fins 10 (four are shown); however, the arrayed fin cooling system 100 is formed by adding additional fins in the manner shown in FIG. 1.

The trailing edge 17 includes a radial fin 21, a first aerodynamically profiled surface 23, and a plurality of cooling projections 25 that are positioned between the first aerodynamically profiled surface 23 and the inner edge 11. The cooling projections 25 are spaced apart from one another by a distance $S_P$. The distance $S_P$ between the cooling projections 25 can be the same such that the cooling projections 25 are equidistantly spaced apart from one another or the distance $S_P$ between the cooling projections 25 can vary among the cooling projections 25. The first aerodynamically profiled surfaces 23 defines a chamber 61 that surrounds the cooling projections 25.

The cooling fins 10 can be formed using a variety of processes including but not limited to stamping, forging, die casting, and profile extrusion plus stamping. For thin cooling fins (e.g. $t_O$ is less than about 0.5 millimeters) sheet extrusion and stamping can be used to form the cooling fins 10. By contrast, for thick cooling fins a process such as die casting or forging can be used to form the cooling fins 10. The use of thinner cooling fins 10 allows for a greater number of the cooling fins 10 to be arrayed with one another; whereas, the use of thicker cooling fins 10 decreases the number of the cooling fins 10 that can be arrayed with one another.

Suitable materials for the cooling fins 10 include but are not limited to aluminum (Al) and alloys of aluminum, copper (Cu) and alloys of copper, gold (Au), or any material that has a good thermal conductivity and that is press workable.

The leading edge 19 includes a base 31, a second aerodynamically profiled surface 33, and a slot 35 that is positioned between the base 31 and the second aerodynamically profiled surface 33. The base 31 is adapted to connect with the component (not shown) so that heat in the component is transferred from the component to the cooling fin 10 via the base 31. Contact between the base 31 and the component can be by direct contact or by intermediate contact. For instance, a thermal interface material (not shown) between the base 31 and the component can be used to effectuate the intermediate contact. In either case, the connection provides for thermal communication of heat from the component to the base 31.

The base 31 can have a surface profile that complements a surface of the component that the base 31 is to be placed in contact with. Preferably, the base 31 has a substantially planar surface profile (i.e. it is substantially flat). A flat surface for the base 31 is amendable to mounting the base 31 on a component having a substantially flat surface, such as a microprocessor, for example.

The first aerodynamically profiled surface 23 and the second aerodynamically profiled surface 33 can be complex surface profiles that include but are not limited to a profile that is a sloped profile, an arcuate profile, a planar profile, or any combination of those profiles. For instance, in FIG. 2, the first aerodynamically profiled surface 23 includes a planar profile that is substantially parallel with the outer edge 13 and extending from the radial fin 21 and then blending with a sloped profile which in turn blends with an arcuate profile that terminates at an outermost of the cooling projections 25. Similarly, the second aerodynamically profiled surface 33 includes a planar profile that blends with an arcuate profile which in turn blends with the outer edge 13.

Figure 4:
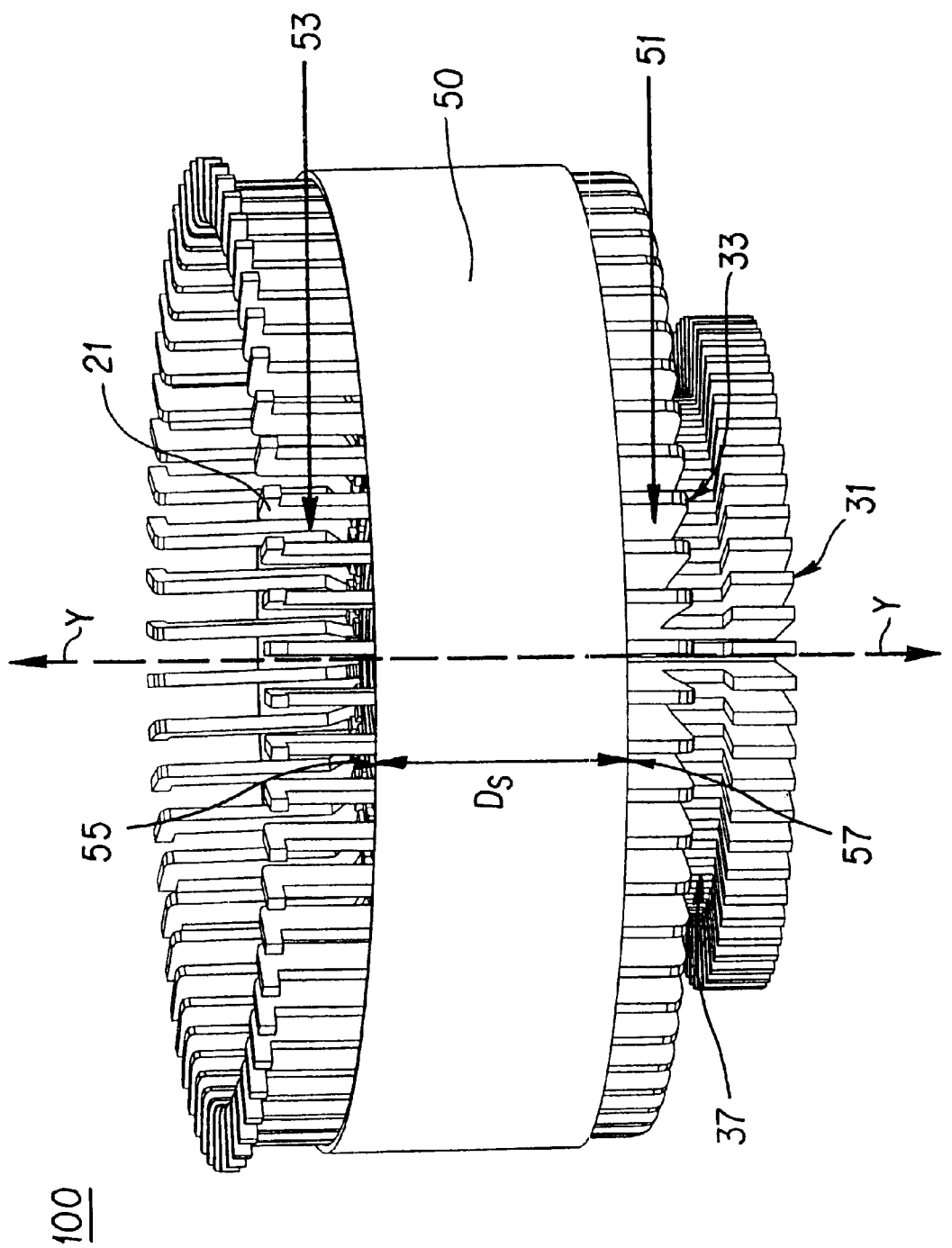
FIG. 4 is a side profile view of an arrayed fin cooling system according to the present invention.
Figure 5:
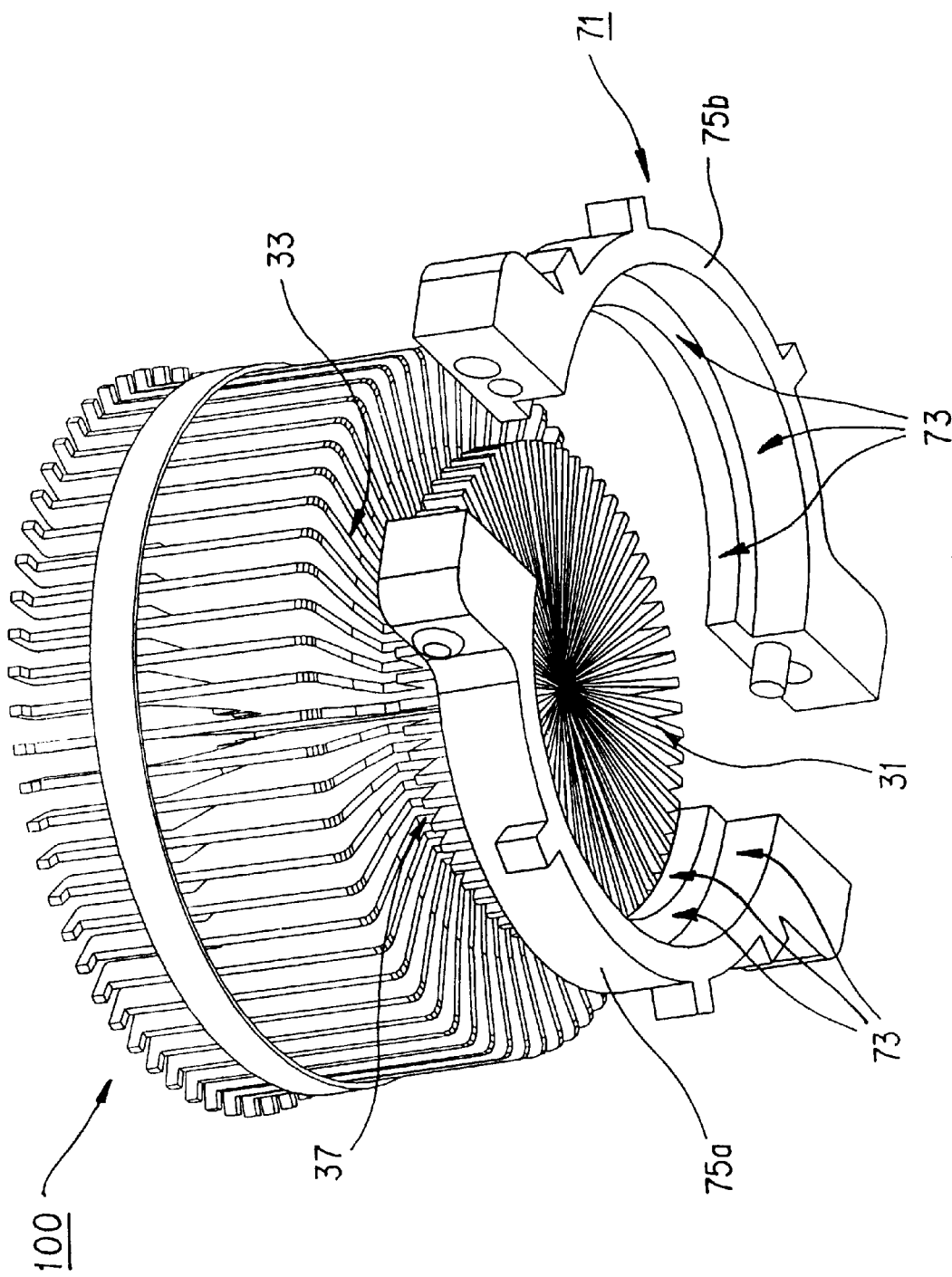
FIG. 5 is a bottom profile view of a base ring prior to connection with an arrayed fin cooling system according to the present invention.
Figure 6B:
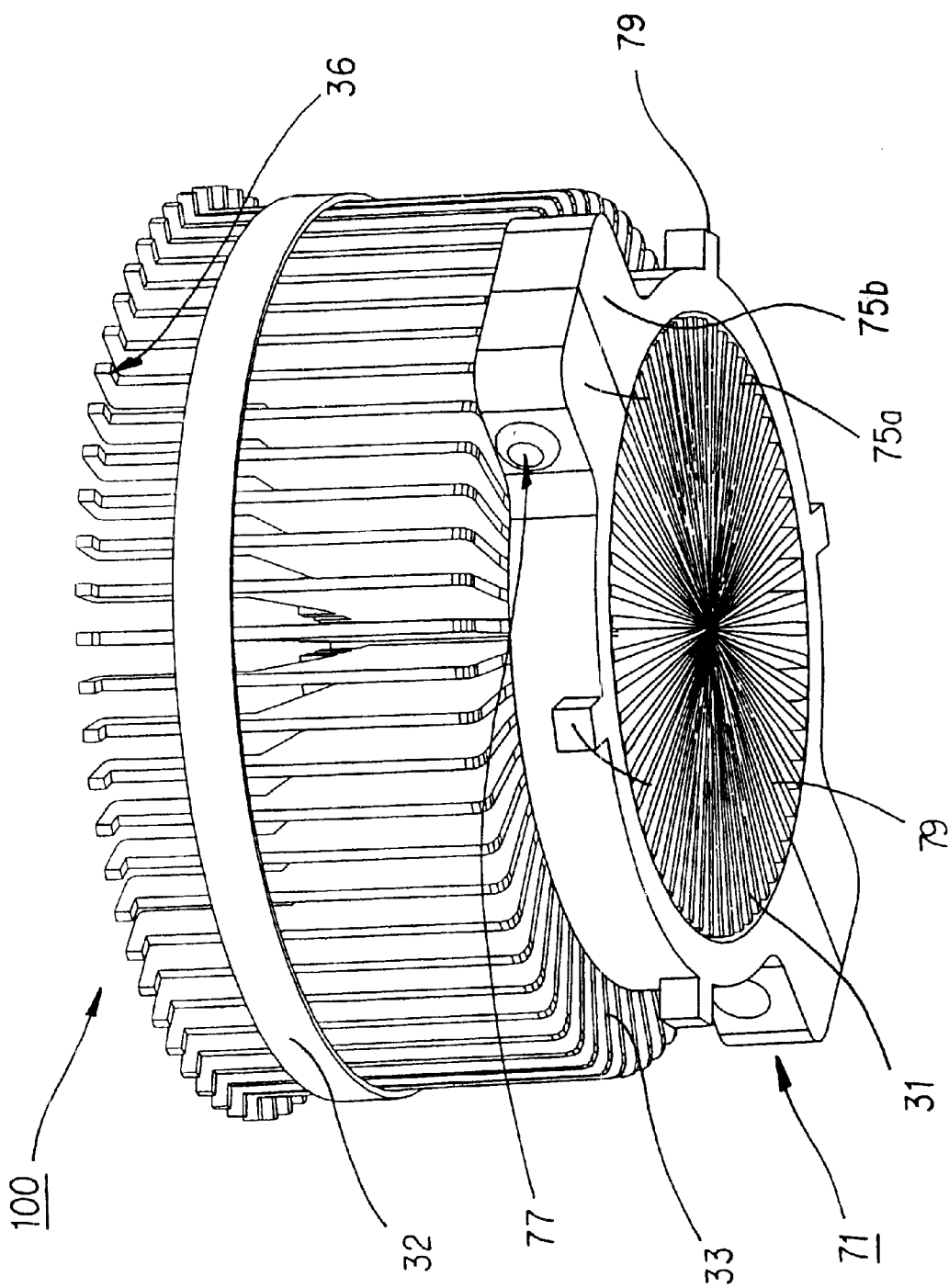

When the cooling fins 10 are arranged in a radial array as illustrated in FIGS. 3 and 4, the slot 35 defines a groove 37 between the base 31 and the second aerodynamically profiled surface 33. In FIG. 5, a base ring 71 includes a collar profile 73 that complements the slot 35. Accordingly, the collar profile 73 also complements the groove 37. In FIGS. 6a and 6b, the collar profile 73 is in contact with the slot 35 of all of the cooling fins 10 and retains the cooling fins 10 in fixed relation with one another.

Preferably, the base ring 71 includes a first split ring 75a and a second split ring 75b that are connected with each other by one or more fasteners 77. The first and second split rings (75a, 75b) include the collar profile 73 and are designed to clamp the cooling fins 10 in fixed relation with one another. A variety of fasteners 77 can be used to connect the first and second split rings (75a, 75b) with each other. For instance, a nut and bolt or a screw can be used. A portion of the first and second split rings (75a, 75b) can be machined to include threads for receiving a machine screw, for example. Prior to attaching the first and second split rings (75a, 75b), the cooling fins 10 are bundled together and then the first and second split rings (75a, 75b) are used to clamp the bundled cooling fins together. Although welding, vacuum brazing, or another joining process can be used to hold the cooling fins 10 in fixed relation with one another, those processes are not required. Consequently, an unnecessary and potentially costly manufacturing step (i.e. welding or the like) is eliminated, and if necessary, the first and second split rings (75a, 75b) can be removed to repair one or more cooling fins 10 or to refurbish a damaged arrayed fin cooling system 100. However, if it is desirable to permanently connect the cooling fins 10 to one another, then welding, vacuum brazing, or the like can be used to effectuate the permanent connection. A fastener including but not limited to a screw, a nut and bolt, a lock pin, and interlock profiles can be used to connect the first and second split rings (75a, 75b) with each other.

In FIGS. 2 and 3, an innermost of the cooling projections 25 (i.e. the cooling projections 25 closest to the inner edge 11) can include an inset portion 27 that is adapted to receive at least one fastener (not shown). The fastener is in contact with the inset portion 27 and retains the cooling fins 10 in fixed relation with one another. The fastener can be used in conjunction with the above mentioned base ring 71 to retain the cooling fins 10 in fixed relation with one another. When the cooling fins 10 are arranged in a radial array, the inset portion 27 of all the innermost of the cooling projections 25 will define a groove (see FIG. 3) and the fastener can be clamped around the groove to hold the cooling fins 10 in fixed relation with one another. Examples of fasteners that can be used include but are not limited to a c-clip and a clipping ring.

In FIG. 1, a radial shield 50 includes an upper edge 55 and a lower edge 57 that are separated from each other by a distance $D_S$. The radial shield 50 is in contact with a portion of the outer edge 13 of all the cooling fins 10 (i.e. the radial shield 50 spans a portion of the outer edge 13). Moreover, the radial shield 50 defines an air inlet 51 between the lower edge 57 and the second aerodynamically profiled surface 33 and defines an air outlet 53 between the upper edge 55 and the radial fin 21. The radial shield 50 can be a sheet of material or a contiguous band of material, that surrounds the outer edges 13 of the cooling fins 10.

Figure 7A:
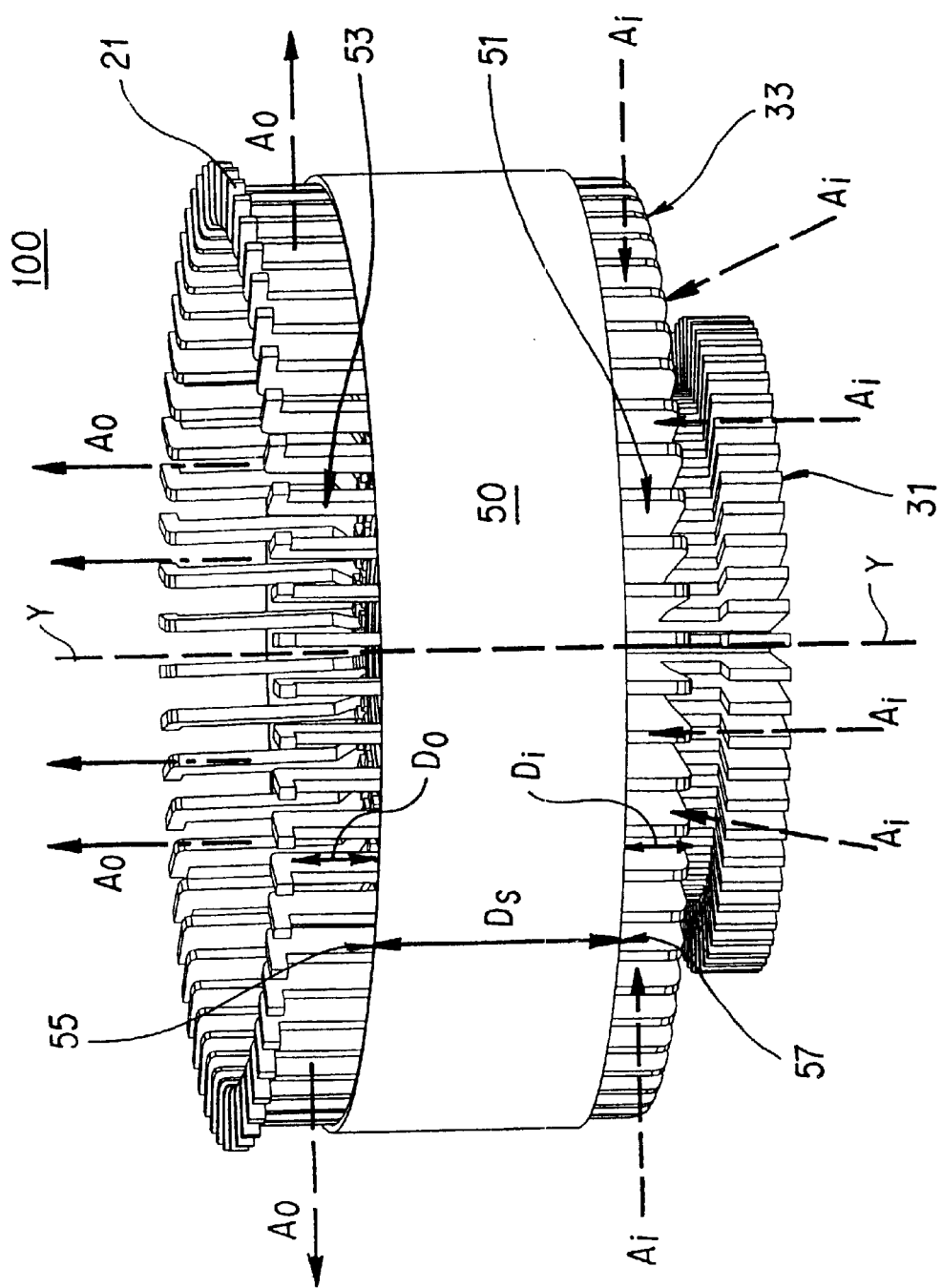

In FIGS. 7a and 7b, heat is removed from the component (not shown) by an air inflow $A_i$ through the air inlet 51. The air inflow $A_i$ can enter the air inlet 51 from a combination of directions including horizontal and vertical (as shown) or at an angle. As the air inflow $A_i$ moves from the air inlet 51 and into the air paths 39 between the cooling fins 10 (see FIG. 3) the radial shield 50 channels the air inflow $A_i$ through the air path 39 and over the cooling surfaces 15 so that heat conducted through the base 31 is transferred to the air inflow $A_i$. Furthermore, the first aerodynamically profiled surface 23 provides a smooth change over direction for the air inflow $A_i$ such that it redirects a portion of the air inflow $A_i$ over the cooling projections 25 as denoted by dashed arrows $A_{1i}$. As a result, additional heat is transferred from the cooling projections 25 to the air inflow $A_i$. The radial shield 50 also channels the air inflow $A_i$ into an air outflow $A_O$ that exits the arrayed fin cooling device 100 through the air outlet 53 and along an axis Y that is substantially parallel with the inner edges 11 of the cooling fins 10 (see FIGS. 2 and 3). The air outflow $A_O$ passes over the radial fins 21 to further dissipate heat from the cooling fins 10.

Without the radial shield 50, air could enter anywhere along the air path 39 and the amount of the air inflow $A_i$ that passes over the cooling surfaces 15 would be reduced with a resulting decrease in heat transfer from the cooling fins 10 to the air inflow $A_i$. Moreover, without the radial shield 50, the air inflow $A_{1i}$ over the cooling projections 25 would be significantly reduced with a resulting decrease in heat transfer from the cooling projections 25.

Because the radial shield 50 guides the air flow from the air inlet 51 to the air outlet 53 (or vice-versa) the distance $D_S$ should be selected to leave an area sufficient for the air inflow $A_i$ via the air inlet 51 and the air outflow $A_i$ via the air outlet 53. Therefore, in FIG. 7a, a distance $D_O$ between the radial fin 21 and the upper edge 55 and a distance $D_i$ between the second aerodynamically profiled surface 33 and the lower edge 57 can be from about 3.0 millimeters to about 10.0 millimeters, for example. The actual distances for $D_O$, $D_i$, and $D_S$ will vary based on application and are not limited to the example distances listed herein.

One advantage of the present invention is that each of the cooling fins 10 is a discrete heat sink that connects with the component to be cooled at the base 31 and transfers heat from the component to the air inflow $A_i$ and the air outflow $A_O$. Consequently, the amount of heat transferred from the component to the arrayed fin cooling device 100 depends in part on the number of cooling fins 10 that are connected with one another as described above. Moreover, the amount of heat transferred can be increased or decreased by increasing or decreasing the number of cooling fins 10 respectively.

Figure 8:
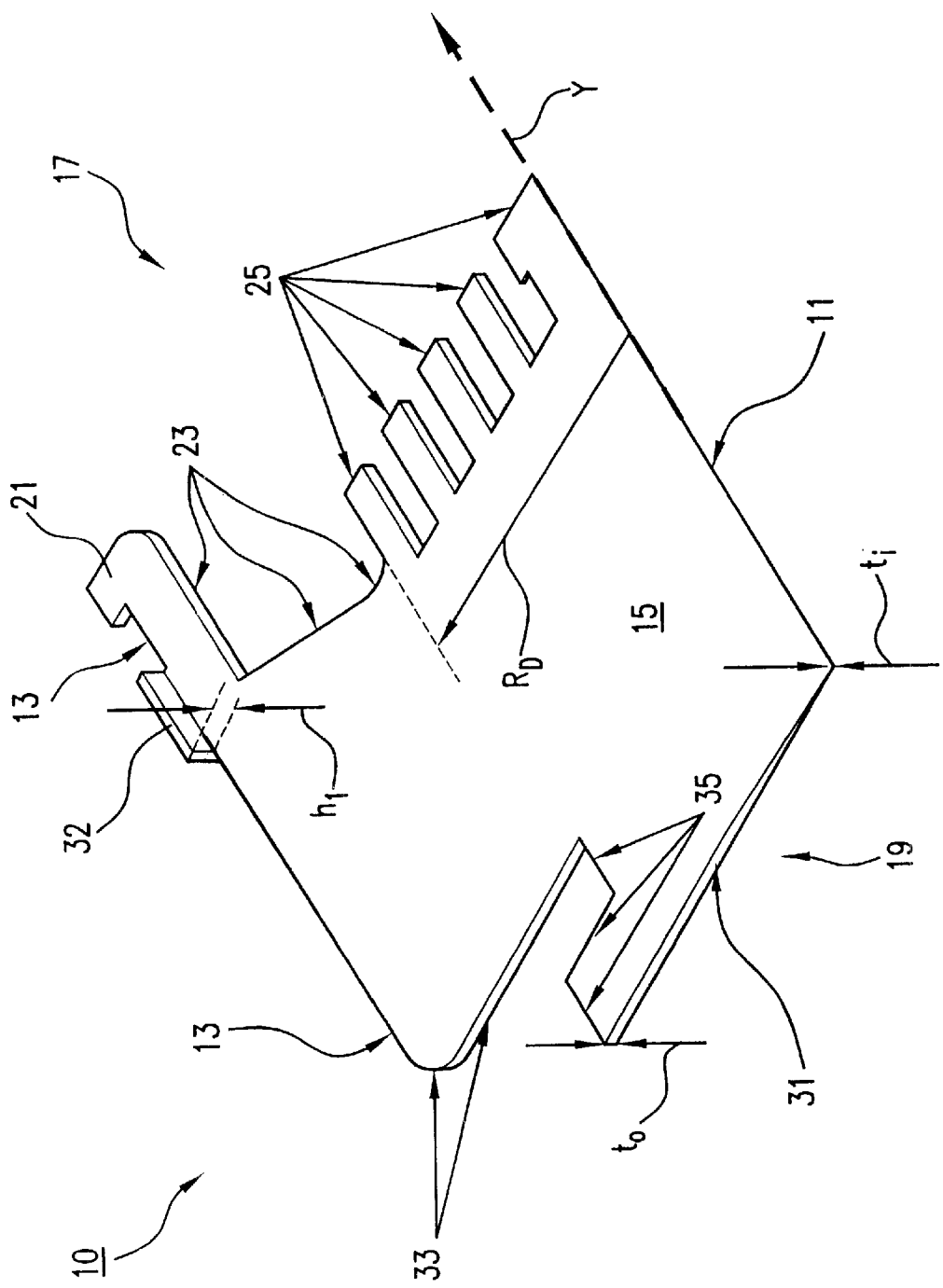
FIG. 8 is a profile view of a discrete cooling fin including a spacer according to the present invention.
Figure 10A:
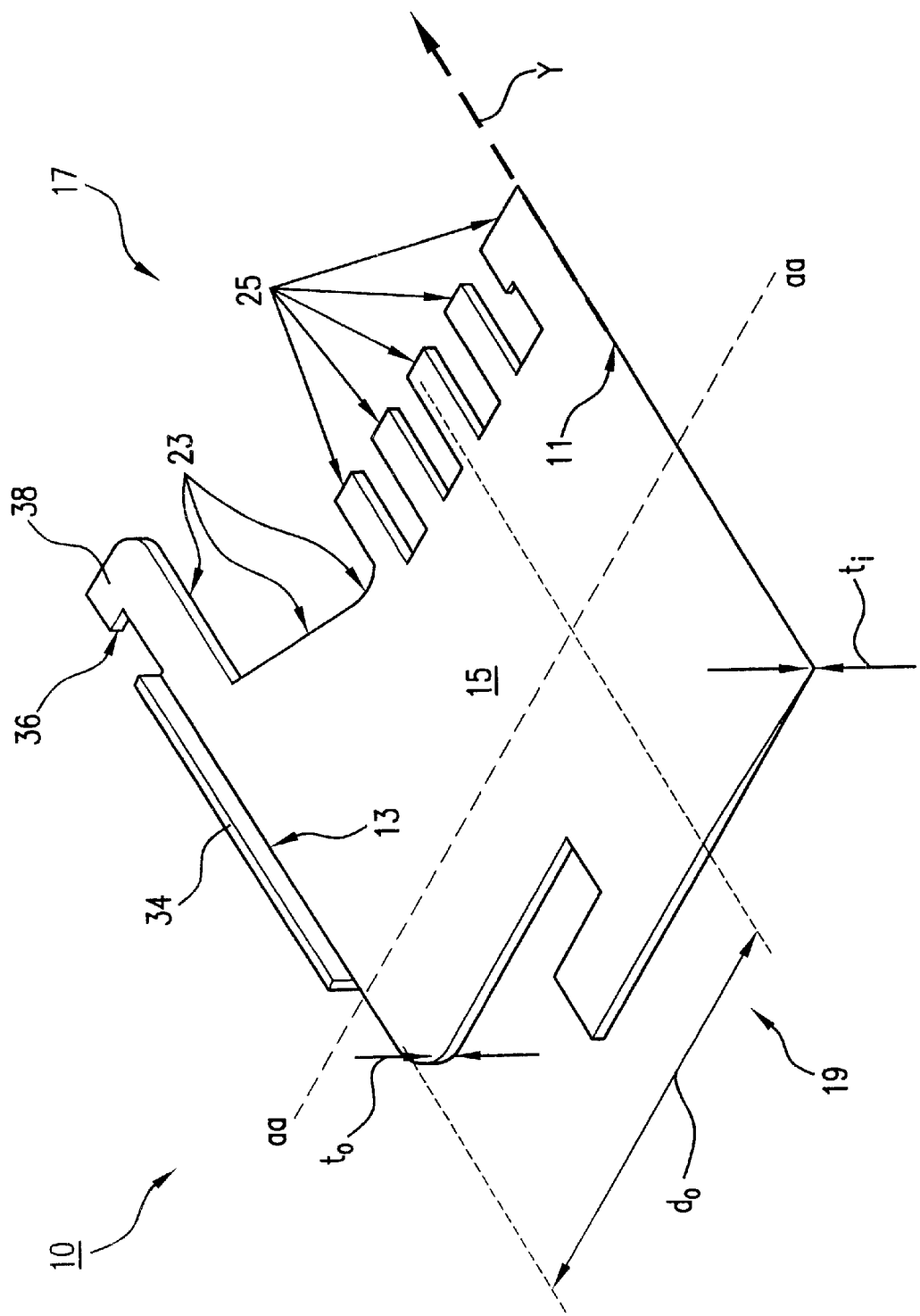

Preferably, the cooling fins 10 are spaced apart from one another by an equal distance. In FIG. 8, an equidistant spacing between adjacent cooling fins 10 can be accomplished using a spacer 32 that is connected with the outer edge 13 of each cooling fin 10. The spacer 32 extends outward of a selected one of the cooling surfaces 15 by a predetermined height $h_1$. When the cooling fins 10 are arranged in a radial array as illustrated in FIGS. 6b and 10d, the spacer 32 of each cooling fin 10 is in contact with the cooling surface 15 of an adjacent cooling fin 10 and the predetermined height $h_1$ defines the equidistant spacing between adjacent cooling fins 10.

Preferably, the spacer 32 is integrally formed with the cooling fin 10 and is bent at an angle with respect to the cooling surface 15 such that the spacer 32 extends outward of the cooling surface 15 by the height $h_1$. By contrast, the spacer 32 can be a separate component that is fixedly connected with the cooling surface 15. If the spacer 32 is a separate component, then it should be heat resistant so that it will not deform or fail due to heat being conducted through the cooling fins 10. A material such as a metal, a ceramic, or plastic can be used for the spacer 32, for example. The spacer 32 can be connected with the cooling surface 15 by gluing or welding, for example. After the cooling fins 10 have been arranged in a radial array as illustrated in FIG. 6b, the radial shield 50 can be connected with the outer edges 13 of the cooling fins 10 as was described above (see FIG. 7a).

Figure 9:
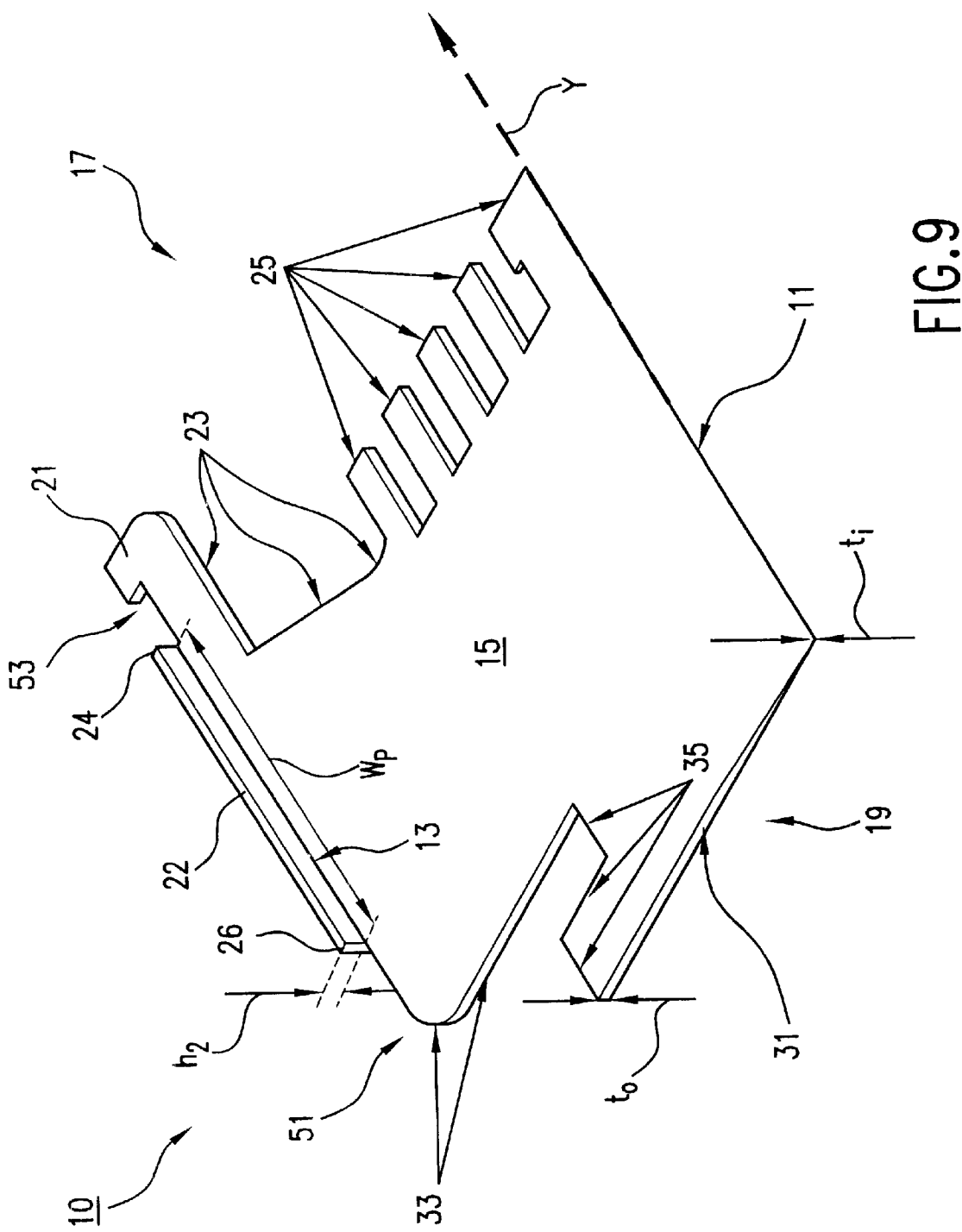
FIG. 9 is a profile view of a discrete cooling fin including a bent profile according to the present invention.

In one embodiment of the present invention, as illustrated in FIG. 9, each cooling fin 10 includes a bent profile 22 that is in contact with the outer edge 13. The bent profile 22 includes a first edge 24 and a second edge 26 that are separated by a first width $W_P$. The bent profile 22 extends outward of a selected one of the cooling surfaces 15 by a profile height $h_2$. When the cooling fins 10 are arranged in a radial array as illustrated in FIGS. 3 and 7b, the bent profile 22 of each cooling fin 10 is in contact with the cooling surface 15 of an adjacent cooling fin 10 so that the bent profiles 22 of all the cooling fins 10 defines the radial shield 50, the air outlet 53 is defined between the first edge 24, and the radial fin 21 and the air inlet 51 is defined between the second edge 26 and the second aerodynamically profiled surface 33. The first width $W_P$ can be identical to the distance $D_S$ between the upper and lower edges (55, 57) of the radial shield 50.

In another embodiment of the present invention, the bent profile 22 operates to space the cooling fins 10 apart from one another by an equal distance. Essentially, the profile height $h_2$ serves as a spacer that equidistantly spaces adjacent cooling fins 10 apart from each other (see FIG. 10e).

The air path 39 between adjacent cooling fins 10 can be defined by the spacer 32 or the bent profile 22 as illustrated in FIGS. 3, 10d, and 10e. Because the air path 39 is narrower in a direction towards the inner edge 11 and is wider in a direction away from the inner edge 11 (see FIG. 3), a greater percentage of the air inflow $A_i$ passes through the wider air paths (39 and 39a) than through the narrower air paths (39b and 39c). Although the actual amount of air flow through those air paths is difficult to quantify and will vary based on application, approximately 80% to 85% of the air flow can flow through the wider air paths (39 and 39a) and approximately 15% to 20% of the air flow can flow through the narrower air paths (39b and 39c).

Figure 11:
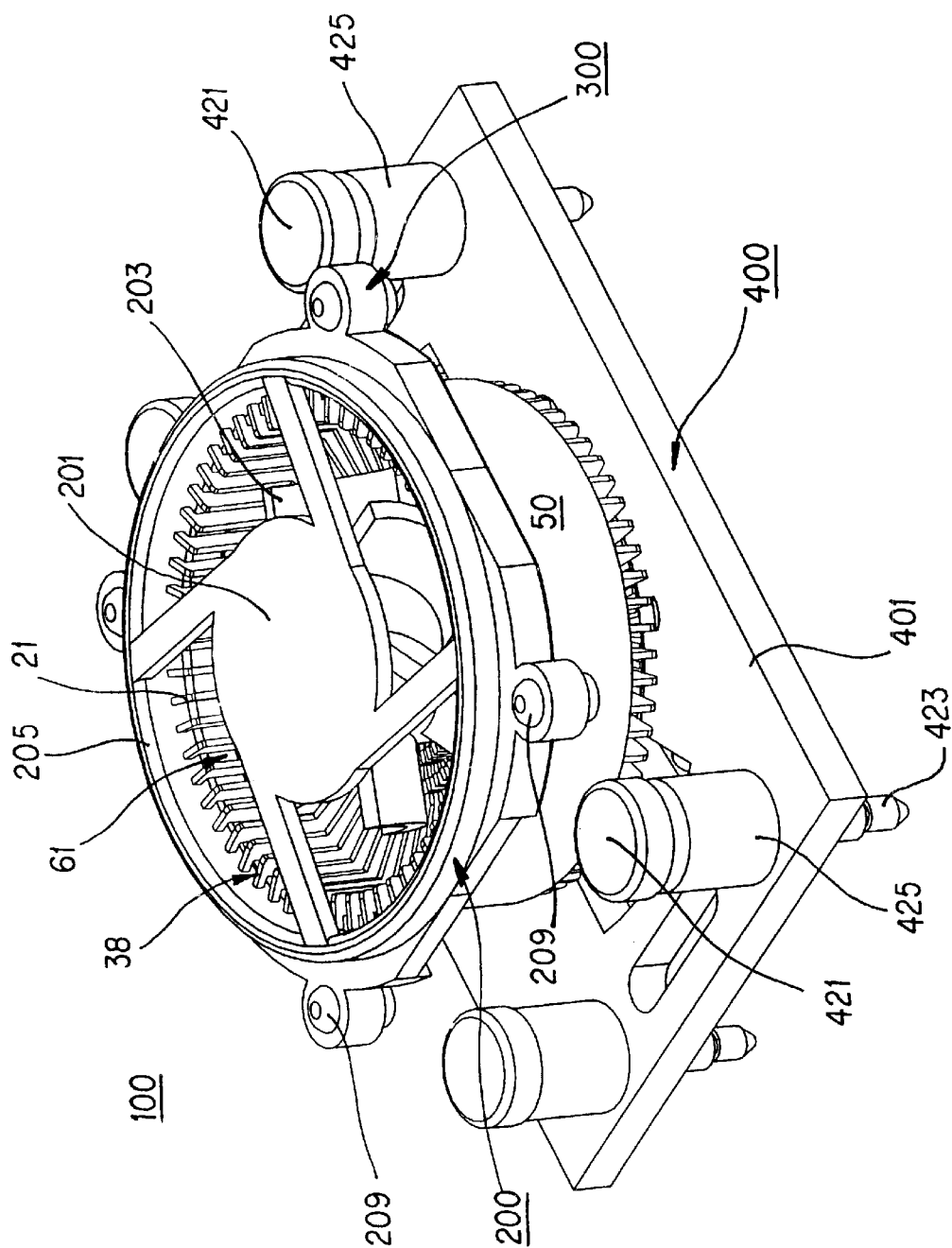
FIGS. 11 and 12 are top plan view and a bottom plan view respectively of an arrayed fin cooling system including a fan, a fan mounting ring, and a base plate according to the present invention.
Figure 12:
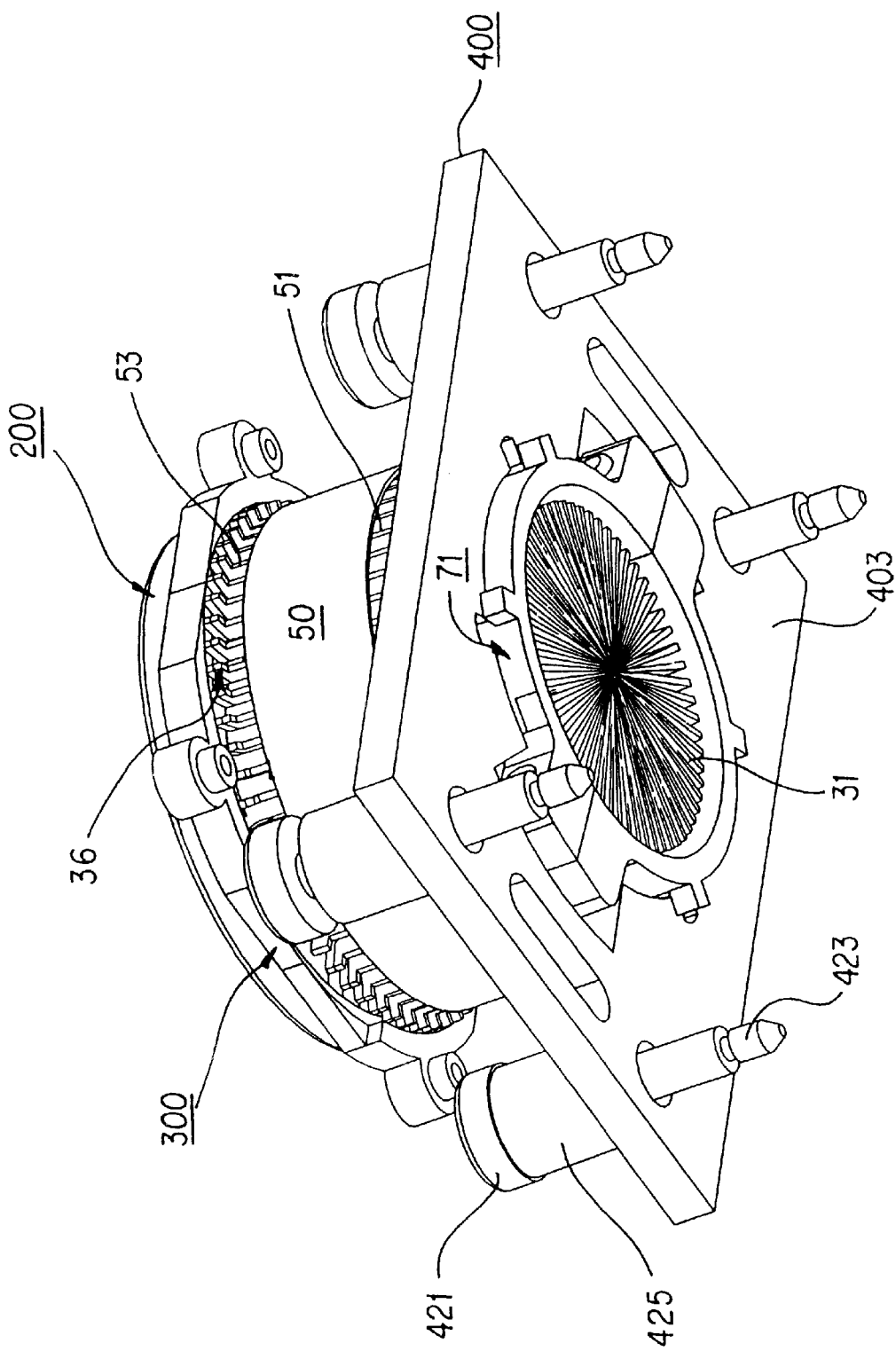
Figure 13:
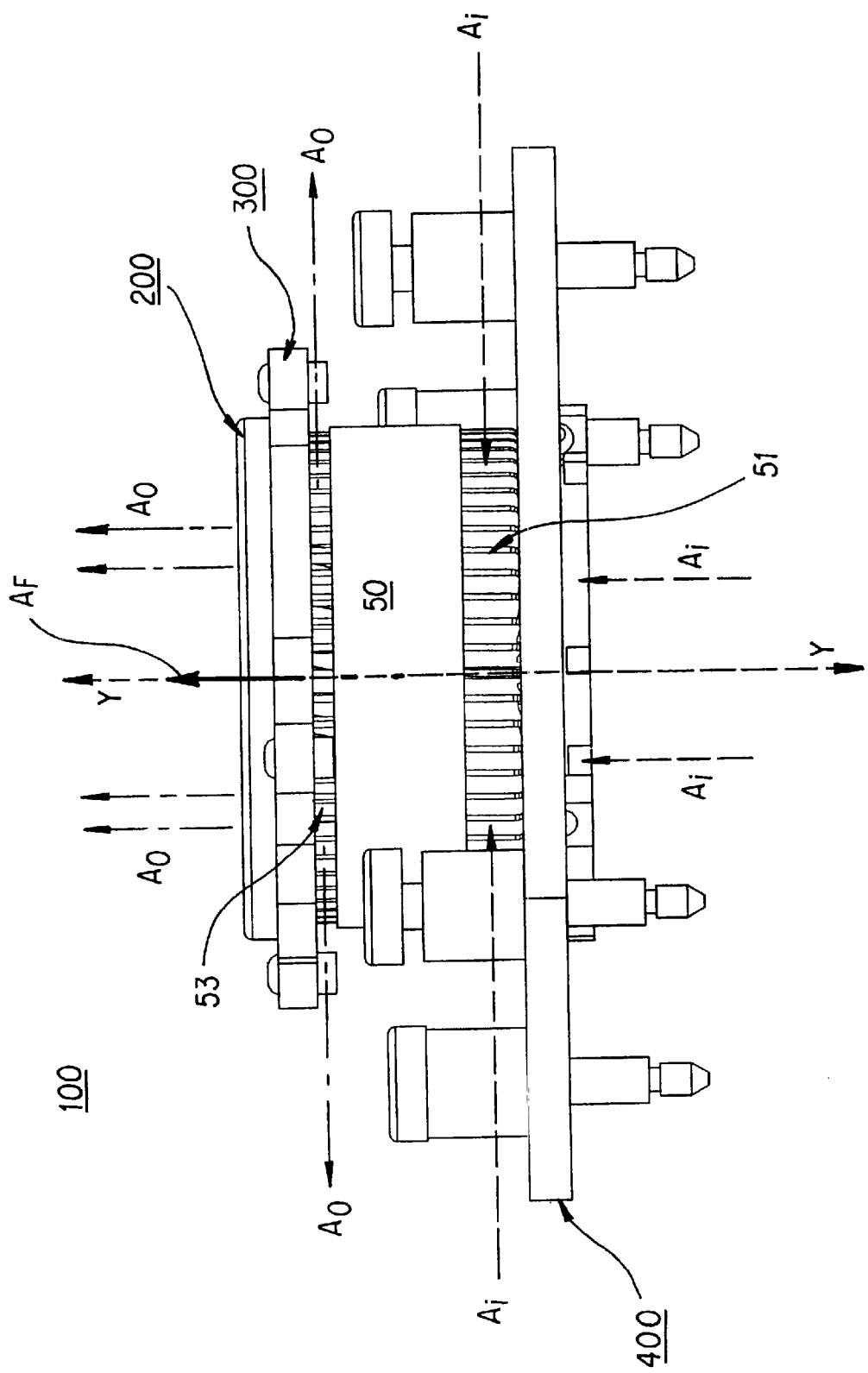
FIGS. 13 and 14 are side plan views depicting a bidirectional air flow through an arrayed fin cooling system according to the present invention.

In FIGS. 11 through 13, the aforementioned air inflow $A_i$ can be generated by a fan 200 that is connected with the cooling fins 10. The fan 200 can include a fan housing 205 that is in contact with to the cooling fins 10, a fan hub 201 that carries a rotor 207 having a plurality of fan blades 203 connected therewith. The fan 200 can generate an air flow $A_F$ that creates a low pressure region within the chamber 61 that generates the air inflow $A_i$.

Figure 14:
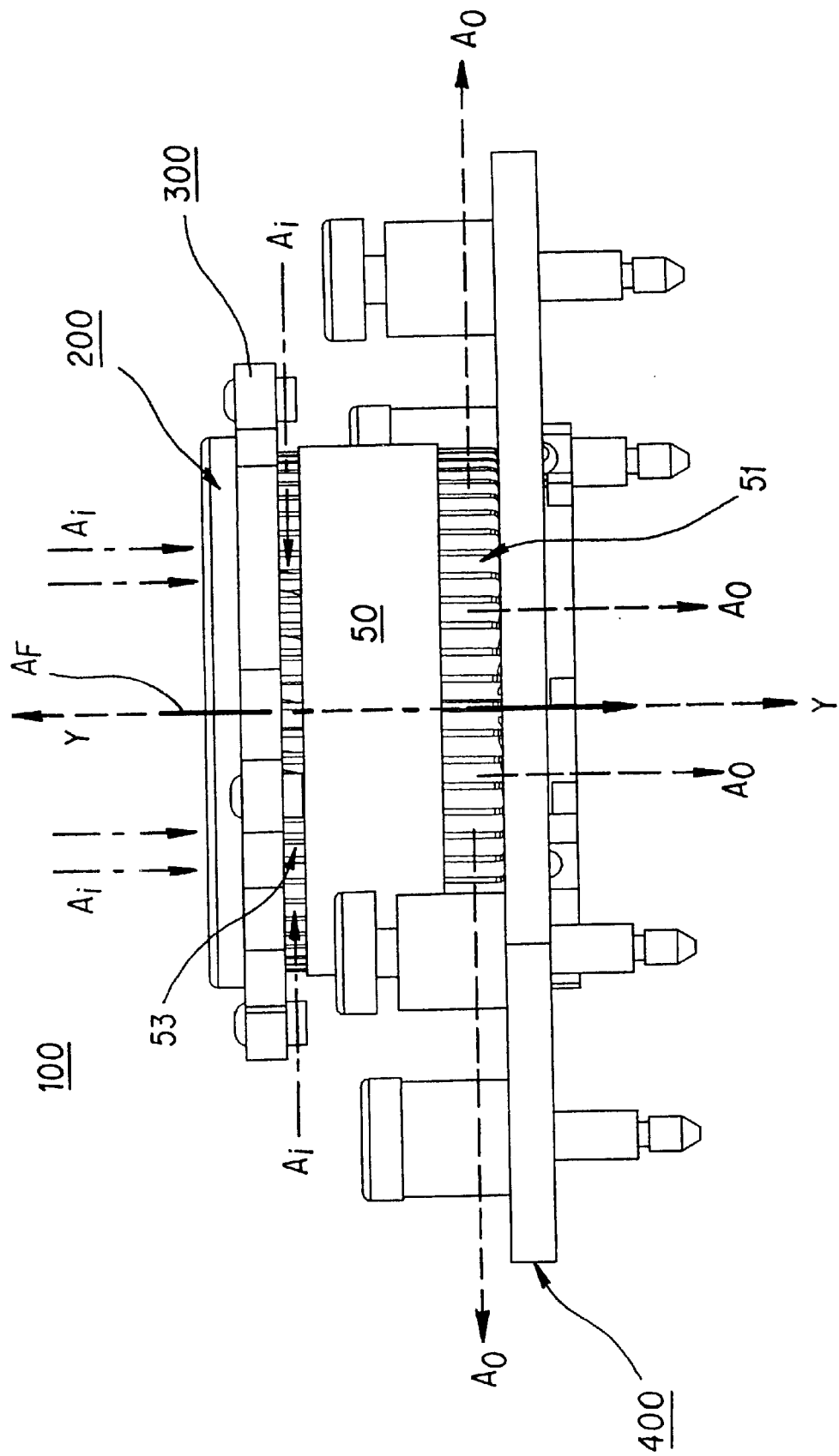

In FIG. 14, the direction of the air flow $A_F$ is reversed from that of FIG. 13 and the air inflow $A_i$ and the air outflow $A_O$ are also reversed. The air flow $A_F$ is into the chamber 61. Accordingly, the air inflow $A_i$ enters the cooling fins 10 via the air outlet 53 and the air outflow $A_O$ exits the cooling fins 10 via the air inlet 51.

Therefore, another advantage of the arrayed fin cooling system 100 of the present invention is that it can effectuate heat transfer from the cooling fins 10 to the air inflow $A_i$ with a bidirectional air flow $A_F$. The fan 200 can either pull air through the cooling fins 10 as illustrated by the air flow $A_F$ in FIG. 13 or push air through the cooling fins 10 as illustrated by the air flow $A_F$ in FIG. 14.

Figure 18A:
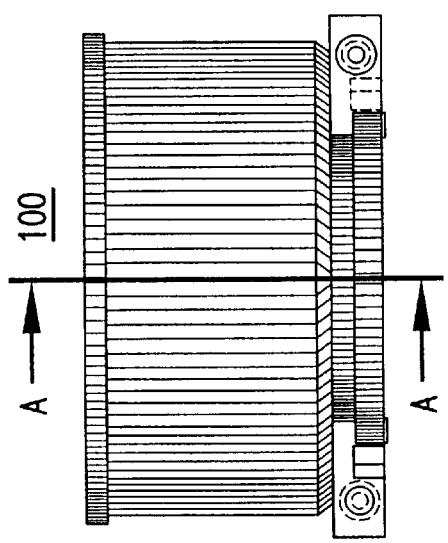
FIGS. 18a through 18c are cross-sectional views depicting a bidirectional air flow according to the present invention.
Figure 18B:
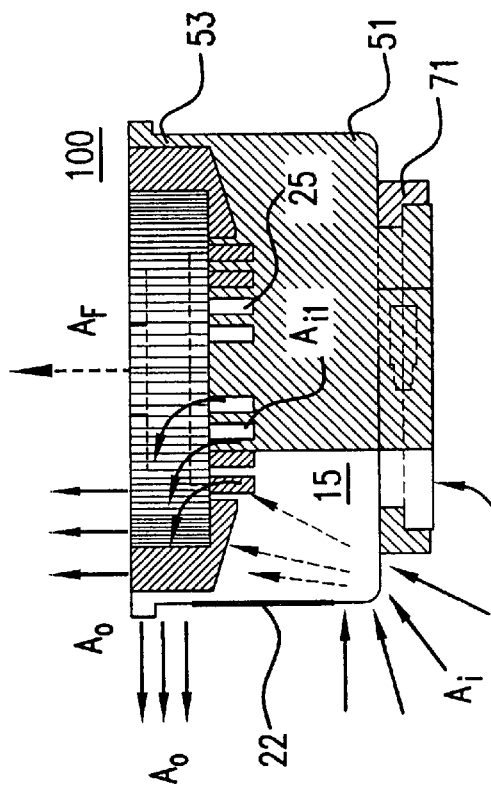

In FIGS. 18a through 18b, bidirectional movement of the air inflow $A_i$ over the cooling surface 15 is illustrated for the air flow $A_F$ when air is pulled through the arrayed fin cooling system 100 (i.e. a pull air flow) and for the air flow $A_F$ when air is blown into the arrayed fin cooling system 100 (i.e. a push air flow). The air flow $A_F$ can be from an external source or from a fan connected with the arrayed fin cooling system 100 as described above.

Figure 18C:
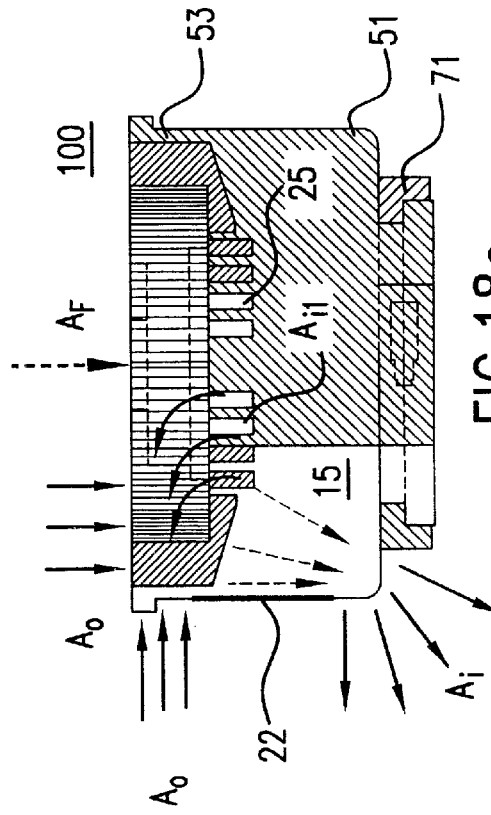

FIGS. 18b and 18c are cross-sectional views along line AA of FIG. 18a. In FIG. 18b, the air flow $A_F$ pulls air through the arrayed fin cooling system 100 and the air inflow $A_i$ enters the air path 39 via the air inlet 51 and passes over the cooling surfaces 15 (see dashed arrows). The first aerodynamically profiled surface 23 redirects a portion of that air inflow $A_i$ into the air inflow $A_{i1}$ that wets over the cooling projections 25 (see arrows $A_{i1}$). The air inflows ($A_i$, $A_{i1}$) exit the arrayed fin cooling system 100 as the air outflow $A_O$ with a portion of the air outflow $A_O$ exiting via the air outlet 53.

Similarly, in FIG. 18c when the air flow $A_F$ is in the opposite direction (i.e. air is blown or pushed into the arrayed fin cooling system 100), a portion of the air inflow $A_i$ enters the air path 39 via the air outlet 53 and passes over the cooling surfaces 15 (see dashed arrows). The first aerodynamically profiled surface 23 redirects a portion of that air inflow $A_i$ into the air inflow $A_{i1}$ that wets over the cooling projections 25 (see arrows $A_{i1}$). The air inflows ($A_i$, $A_{i1}$) exit the arrayed fin cooling system 100 as the air outflow $A_O$ which exit via the air inlet 51.

The radial fin 21 of each cooling fin 10 can include a seating surface 38 (see FIGS. 3 and 10a) for mounting the fan 200 with the cooling fins 10. Preferably, the seating surface 38 has a surface profile that complements a profile of the fan housing 205. For instance, the fan housing 205 can have a planar surface and the seating surface 38 can be a substantially planar surface so that the fan housing 205 can be mounted with the seating surface 38 as illustrated in FIG. 11.

In FIGS. 3, 6a and 6b, the cooling fins 10 can include a lip 36 that extends outward of the outer edge 13 and is positioned below the seating surface 38 of the radial fin 21. In FIGS. 11 through 13, a fan mounting ring 300 is positioned adjacent to the lip 36 and a fastener 209 is used to connect the fan mounting 300 ring with the fan 200 and for urging the fan mounting ring 300 into contact with the lip 36 so that the fan 200 is fixedly mounted on the seating surface 38. The fastener 209 can be a screw or a nut and bolt, for example.

In one embodiment of the present invention, as illustrated in FIGS. 8 and 15, the cooling projections 25 are positioned within a predetermined radial distance $R_D$ from the axis Y or from the inner edge 11. The predetermined radial distance $R_D$ can be selected based on a hub radius $R_H$ of a fan. For instance, in FIG. 15, if the hub 207 of the fan 200 has a hub radius $R_H$, then the predetermined radial distance $R_D$ will be less than or equal to the hub radius $R_H$ (that is: $R_D \leq R_H$). Accordingly, when the fan 200 is mounted to the cooling fins 10, all of the cooling projections 25 including an outermost of the cooling projections 25 will be positioned within the hub radius $R_H$. One disadvantage to prior cooling devices is noise generated by air turbulence and air shock losses caused by an air flow from a fan. By restricting the radial position of the cooling projections 25 to be within the predetermined radial distance $R_D$, the cooling projections 25 will not come under a swept area 203a of the fan blades 203 thereby reducing air turbulence and obstructions to air flow within the chamber 61. As a result, less noise is generated by the arrayed fin cooling system 100 of the present invention. Reduced noise levels are highly desirable in portable PC's and in desktop PC's. An additional benefit of restricting the radial position of the cooling projections 25 to be within the predetermined radial distance $R_D$ is that the reduced turbulence allows the air inflow $A_{1i}$ to pass over the cooling projections 25 thereby enhancing heat transfer from the cooling fins 10.

The predetermined radial distance $R_D$ and the number of cooling projections 25 will vary based on the application and on the hub radius $R_H$. However, as an example, if the predetermined radial distance $R_D$ is about 17.5 millimeters, then there can be 3 to 5 of the cooling projections 25 within the predetermined radial distance $R_D$.

As mentioned above, the cooling surfaces 15 are spaced apart from each other by a distance that decreases from the outer edge 13 to the inner edge 11 (i.e. $t_O > t_i$). The distance ($t_O, t_i$) can be continuously variable from the outer edge 13 to the inner edge 11. Preferably, the distance $t_O$ is substantially constant for a distance $d_O$ from the outer edge 13 and then the distance between the cooling surfaces 15 decreases to $t_i$ at the inner edge 11 as illustrated in the cooling surfaces 15. For instance, $t_O$ can be 1.60 millimeters and $t_i$ can be 0.5 millimeters.

In FIGS. 10b and 10c, a cross-sectional view along line aa of the cooling fin 10 of FIG. 10b illustrates the decreasing distance between the cooling surfaces 15 from the outer edge 13 to the inner edge 11. The distance to is substantially constant for the distance $d_O$ from the outer edge 13. Thereafter, the distance between the cooling surfaces 15 decreases to $t_i$ at the inner edge. Accordingly, a variation in the distance between the opposed cooling surfaces 15 defines a cross-sectional profile of the cooling fin 10. The cross-sectional profile can include a sloped profile, a wedge profile, an equilateral triangle, and a right triangle. In FIG. 10b, the cross-sectional profile is that of a right triangle and in FIG. 10c the cross-sectional profile is that of an equilateral triangle. As a point of reference, the right triangle and the equilateral triangle have a base at a point indicated by dashed line b. The sloped profile and the wedge profile can be variations on the cross-sectional profiles of the right triangle and the equilateral triangle.

The cooling fin 10 should be as close to zero thickness as is possible at the inner edge 11 (that is $t_i \approx 0$). But a zero thickness is not practically possible; therefore, the cooling fin 10 should be as thin as possible at the inner edge 11. Preferably, the cooling fin 10 has a thickness $t_i$ at the inner edge 11 that is about 0.07 millimeters or less.

In FIGS. 10b and 10c, the cooling fin 10 can have a taper angle $\theta$ measured between the cooling surfaces 15. The taper angle $\theta$ applies to the aforementioned cross-sectional profiles and the taper angle $\theta$ can include a wide range of angles that will be determined by the application. For example, if the taper angle $\theta$ is 2.0 degrees, then 180 of the cooling fins 10 can be mounted in the arrayed fin cooling system 100 (that is: 360 degrees÷2.0 degrees=180). As another example, if the taper angle $\theta$ is 6.0 degrees, then 60 of the cooling fins 10 can be mounted in the arrayed fin cooling system 100 (that is: 360 degrees÷6.0 degrees=60). Preferably, the taper angle $\theta$ is in a range from about 2.0 degrees to about 6.0 degrees. The taper angle $\theta$ can also determine the spacing between adjacent cooling fins that defines the air paths (39, 39a, 39b, 39c) and the amount of air flow through those air paths.

As was described above, the amount of waste heat that can be dissipated by the arrayed fin cooling system 100 is partially dependent on the number of cooling fins 10 that are contained within the arrayed fin cooling system 100. The amount of waste heat is also dependent on a contact area of the component to be cooled that is in contact with the base 31 of all the cooling fins 10. For example, to dissipate about 60.0 W of waste heat from a component having a contact area of 30 mm *30 mm, the arrayed fin cooling system 100 would need approximately 72 cooling fins As a further example, with an outside diameter of about 64.0 mm measured across the radial shield 50 and a height of about 38.0 mm measured from the base 31 to the planar surface 38, the arrayed fin cooling system 100 has a performance factor of about 0.26° C./Watt.

In FIGS. 10d and 10e, the cooling fins 10 are connected with one another along a portion of their cooling surfaces 15 with their inner edges 11 positioned proximate to one another such that the cooling fins 10 diverge from one another in a radially outward direction to define the air path 39 between adjacent cooling fins 10. The spacer 32 or the bent profile 22 can be used to equidistantly space adjacent cooling fins 10 apart from each other.

Figure 16A:
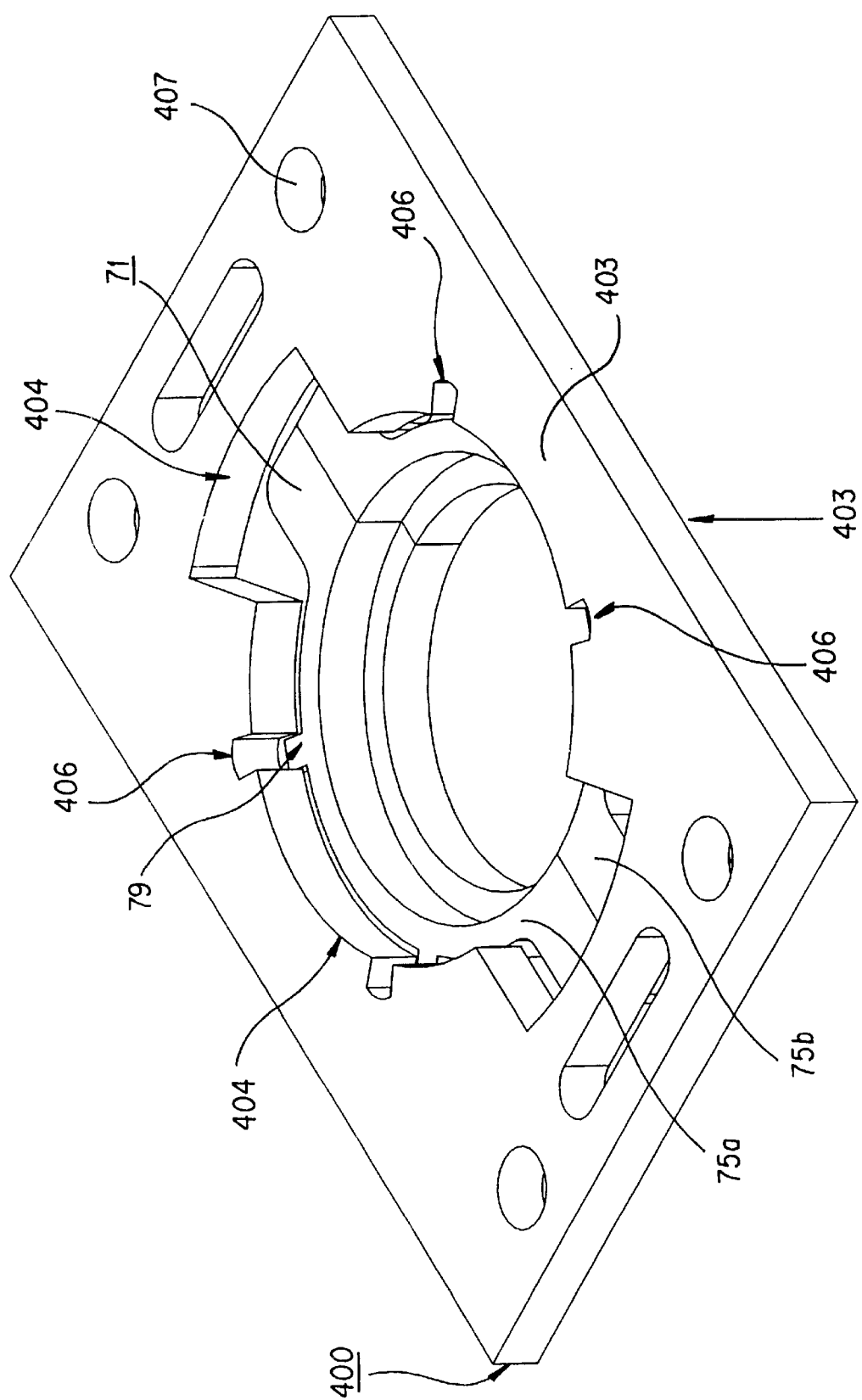
FIGS. 16a through 16e depict mounting a base ring with a base plate according to the present invention.
Figure 16B:
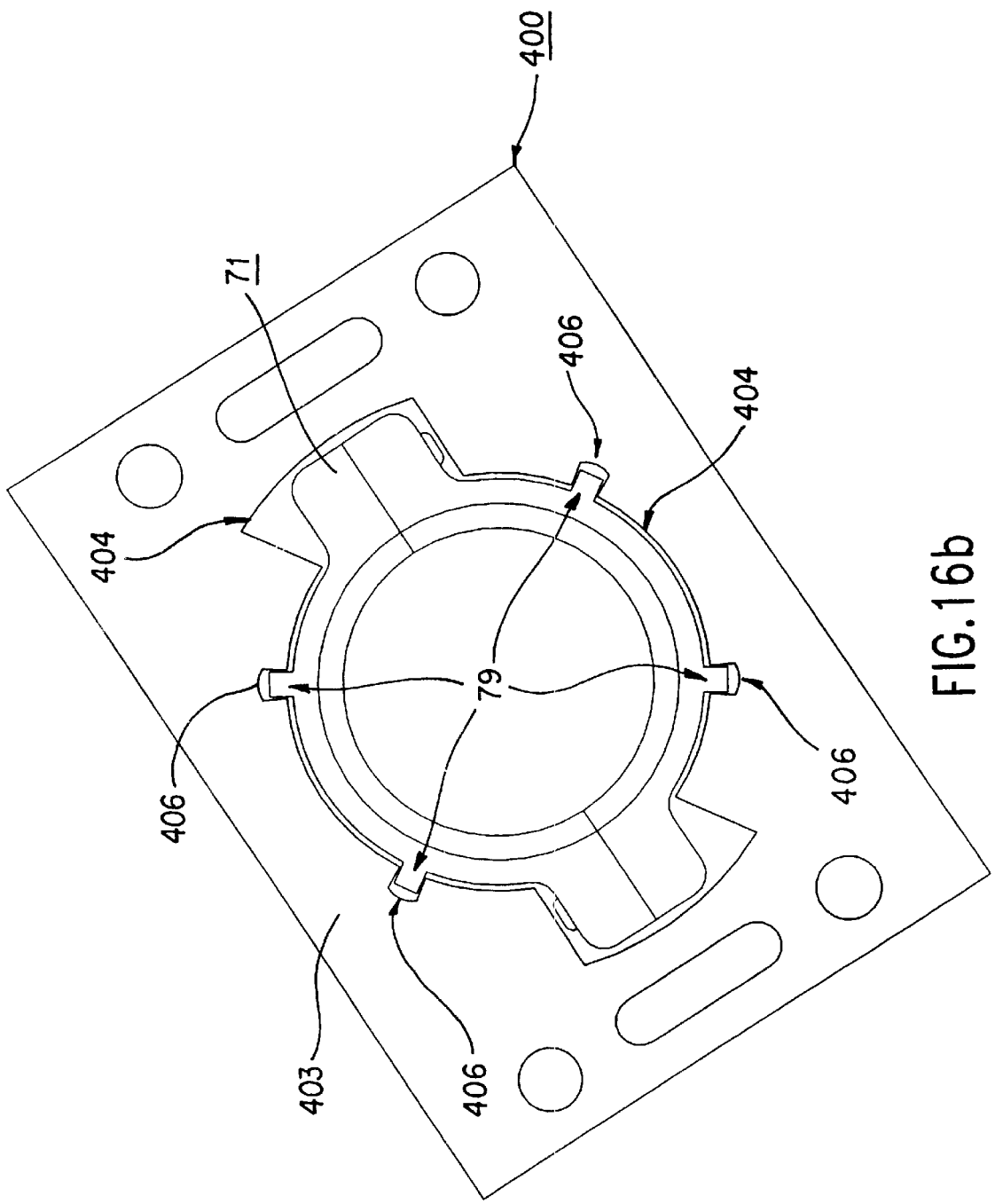
Figure 16C:
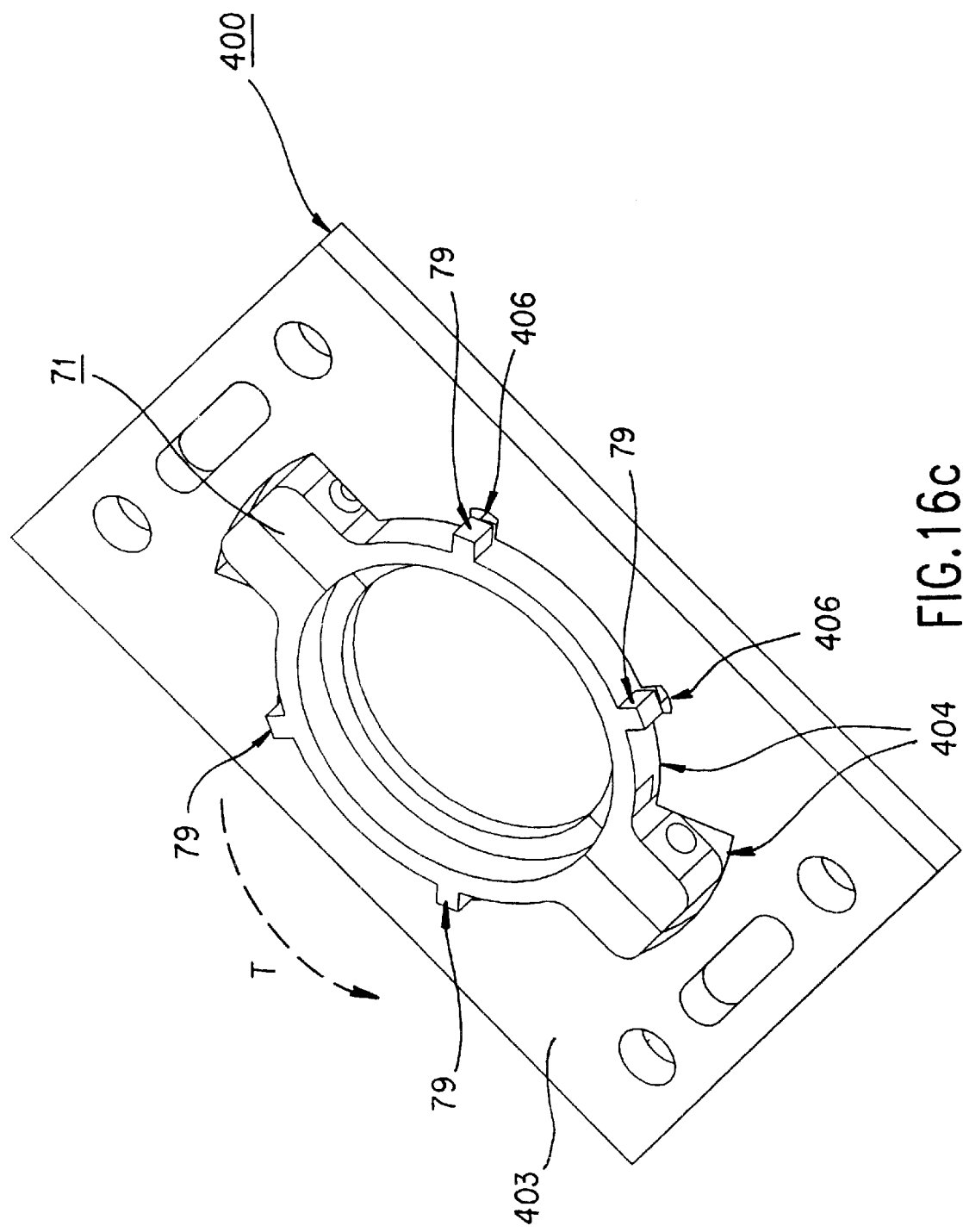

In FIGS. 6a and 6b, the base ring 71 can include a plurality of key profiles 79 positioned on the first and second split rings (75a, 75b). The key profiles 79 are adapted to facilitate mounting of the base ring 71 with a base plate 400 as illustrated in FIGS. 16a through 16c. The base plate 400 includes a mounting surface 401, a base surface 403, and an aperture 404 having a profile that complements the base ring 71. That is, the aperture 404 has a shape that complements a shape of the base ring 71. The aperture 404 further includes a plurality of lock profiles 406 that complement the key profiles 79 of the first and second split rings (75a, 75b). Preferably, the base plate 400 is a planar material and the mounting surface 401 and the base surface 403 are opposed surfaces that are substantially parallel to each other.

In FIG. 16a the base ring 71 is positioned on the mounting surface 401 with the key profiles 79 aligned with their respective lock profiles 406 so that the base ring 71 can be inserted through the aperture 404 and so that the second aerodynamically profiled surface 33 (not shown) is in contact with the mounting surface 401. In FIG. 16b, the key profiles 79 are positioned in alignment with their respective lock profiles 406 so that the base ring 71 can be pushed through the aperture 404.

Figure 16D:
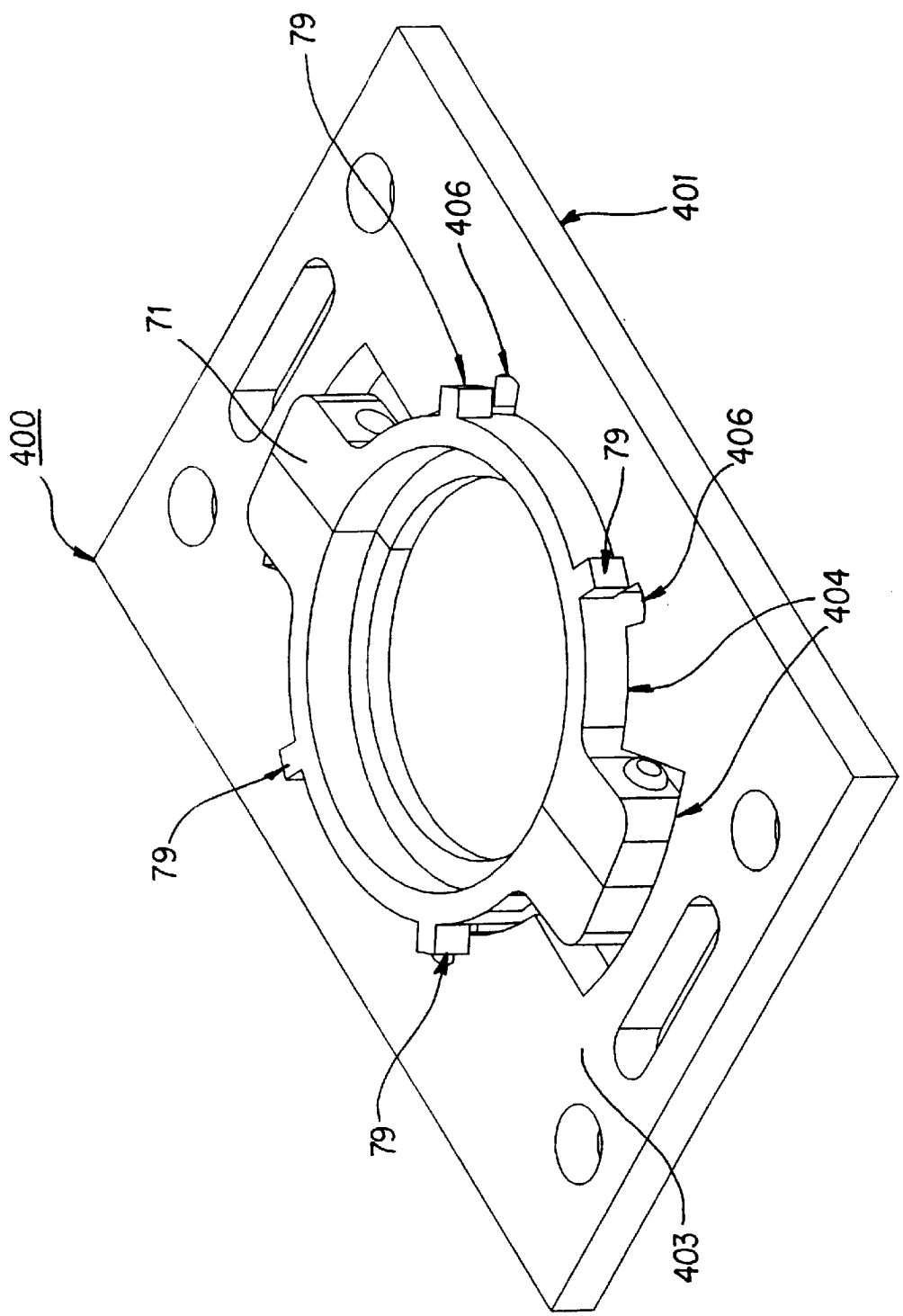

In FIG. 16c, the key profiles 79 are aligned with their respective lock profiles 406 and are positioned such that they surpass the base surface 403 (i.e. they are above the base surface 403). The base ring 71 then is twisted (see dashed arrow T) to rotate the key profiles 79 into engagement with the base surface 403 such that the base ring 71 is removably locked with the base plate 400, as illustrated in FIG. 16d. Removal of the base ring 71 is the reverse of insertion.

Figure 16E:
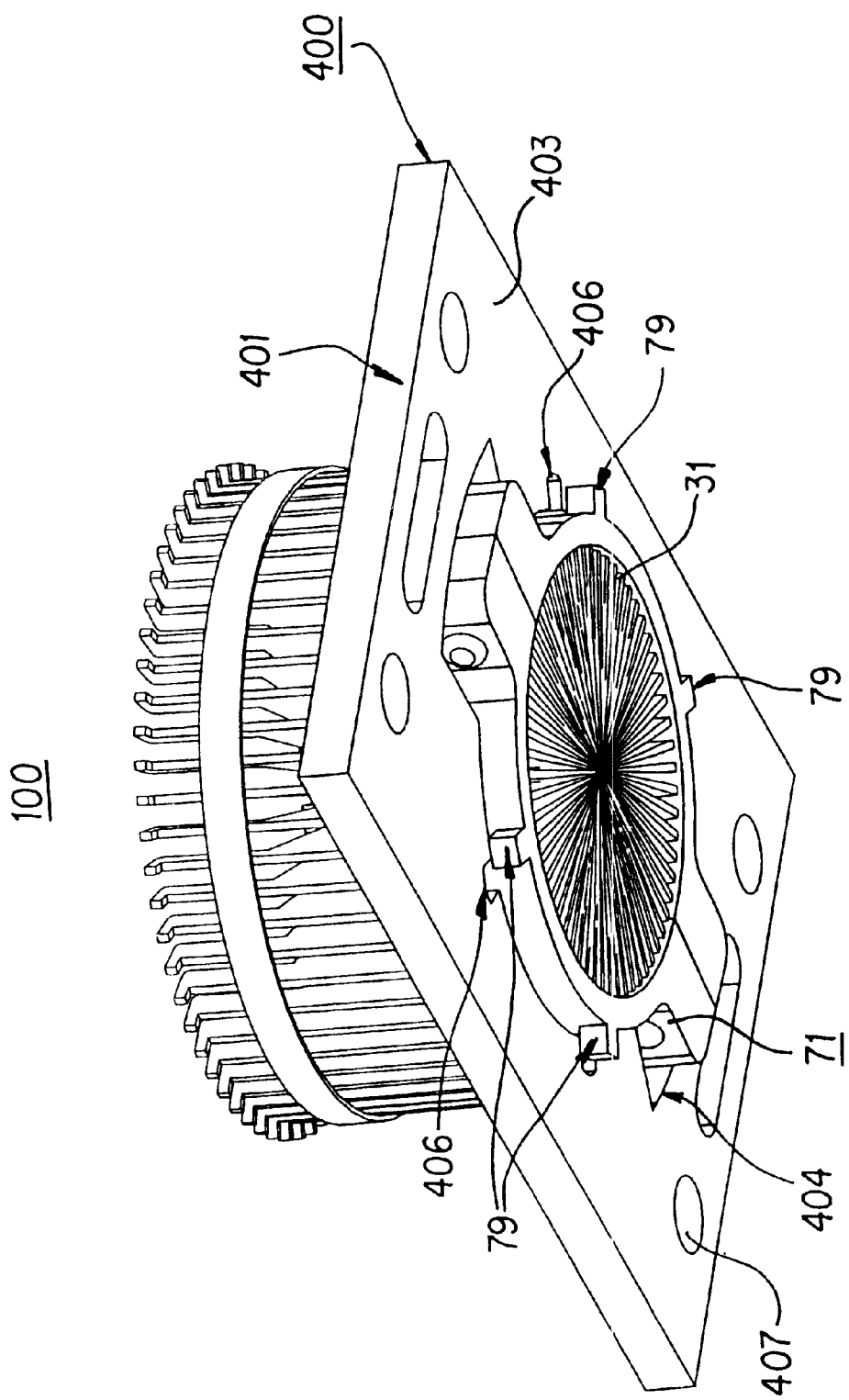

In FIG. 16e, after insertion, a portion of the second aerodynamically profiled surface 33 can remain in contact with the mounting surface 401. In FIGS. 16a through 16d, the arrayed fin cooling system 100 is not shown for purposes of illustrating insertion and removal of the base ring 71 in the base plate 400; however, the steps set forth above in reference to FIGS. 16a through 16d apply with the arrayed fin cooling system 100 already mounted in the base ring 71.

The base plate 400 can include a plurality of through holes 407 for connecting a fastener or the like to the base plate 400 to allow for connecting the base plate 400 with a substrate such as PC board or with a connector such as a PGA connector. The base plate 400 can be made from a variety of rigid materials including metals, plastic, and composites. For example, aluminum (Al) can be used for the base plate 400.

Figure 17:
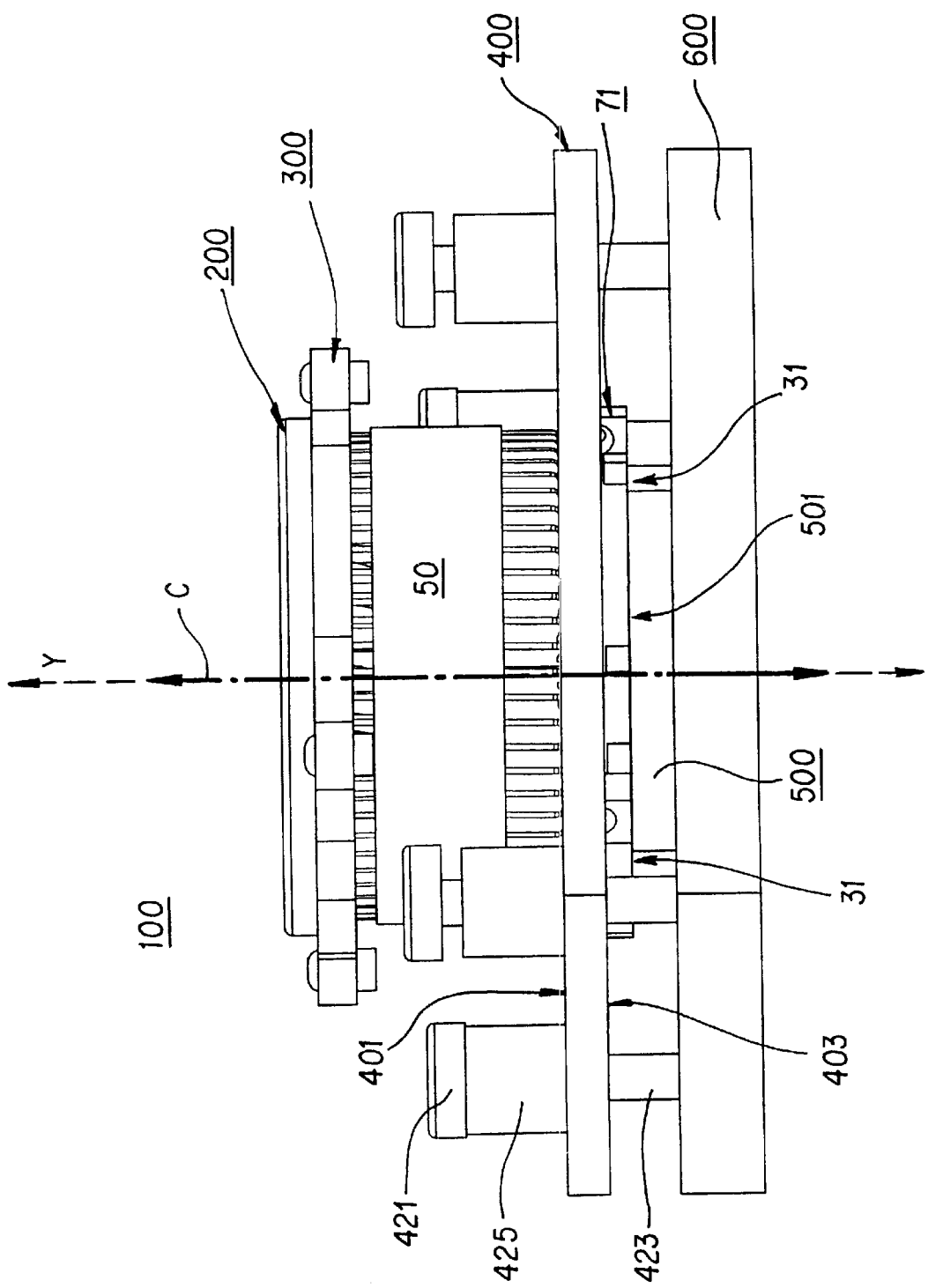
FIG. 17 is a side profile view of an arrayed fin cooling system mounted in contact with a component to be cooled according to the present invention.

In FIG. 17, a fastener 421 that includes a spring 425 and a threaded shank 423 is inserted in the through holes 407. A component 500 to be cooled by the arrayed fin cooling system 100 is carried by a substrate 600. The substrate 600 can be a PC board or a PGA connector, for example. The substrate 600 can have threaded holes (not shown) for receiving the threaded shank 423 of the fastener 421. With the base plate 400 mounted with the substrate 600, the base 31 of the cooling fins 10 is positioned in contact with a surface 501 of the component 500. Preferably, the base plate positions the axis Y in coaxial alignment with a center axis C of the component 500. The springs 425 are operative to exert a contact force between the component 500 and the base 31 thereby reducing contact resistance so that heat is effectively and efficiently transferred from the component surface 501 to the base 31. Preferably, the contact force acts along the axes (Y, C). That is, the contact force is coaxial with the axes (Y, C).

Although several embodiments of the present invention have been disclosed and illustrated, the invention is not limited to the specific forms or arrangements of parts so described and illustrated. The invention is only limited by the claims.

What is claimed is:

1. An arrayed fin cooling system for removing heat from a component, comprising:

a plurality of discrete cooling fins, wherein each discrete cooling fin includes an inner edge, an outer edge, opposed cooling surfaces that are spaced apart by a distance that decreases from the outer edge to the inner edge, a leading edge, and a trailing edge, the cooling fins are connected with one another along a portion of their cooling surfaces with their inner edges positioned proximate to one another such that the cooling fins diverge from one another in a radially outward direction to define an air path between adjacent cooling fins, wherein the trailing edge includes a radial fin, a first aerodynamically profiled surface, and a plurality of spaced apart cooling projections positioned between the first aerodynamically profiled surface and the inner edge, and wherein the leading edge includes a base adapted to connect with the component so that heat is transferred from the component to the cooling fin, a second aerodynamically profiled surface, and a slot positioned between the base and the second aerodynamically profiled surface;

a base ring including a collar profile that complements the slot, the collar profile is in contact with the slot of each cooling fin and retains the cooling fins in fixed relation with one another; and a radial shield including an upper edge and a lower edge separated by a distance, the radial shield is in contact with a portion of the outer edges of the cooling fins, and the radial shield defines an air inlet between the lower edge and the second aerodynamically profiled surface and defines an air outlet between the upper edge and the radial fin, and wherein heat is removed from the component by an air inflow through the air inlet, the radial shield channels the air inflow through the air path and over the cooling surfaces, the first aerodynamically profiled surface redirects a portion of the air inflow over the cooling projections, and the radial shield is operative to channel the air inflow into an air outflow that exits through the air outlet and along an axis that is substantially parallel with the inner edges.

2. The arrayed fin cooling system as set forth in claim 1, wherein the cooling fins are equidistantly spaced apart from one another by a spacer connected with the outer edge of each cooling fin, the spacer extends outward of a selected one of the cooling surfaces by a predetermined height, and the spacer is in contact with the cooling surface of an adjacent cooling fin.

3. The arrayed fin cooling system as set forth in claim 1, wherein each cooling fin includes a bent profile in contact with the outer edge, the bent profile extends outward of a selected one of the cooling surfaces by a profile height, and the bent profile includes a first edge and a second edge separated by a first width, and wherein the bent profile is in contact with the cooling surface of an adjacent cooling fin so that the radial shield is defined by the bent profiles of all the cooling fins and the air outlet is defined between the first edge and the radial fin and the air inlet is defined between the second edge and the second aerodynamically profiled surface.

4. The arrayed fin cooling system as set forth in claim 3, wherein the cooling fins are equidistantly spaced apart from one another by the bent profile.

5. The arrayed fin cooling system as set forth in claim 1 and further comprising a fan connected with the cooling fins and operative to generate the air inflow.

6. The arrayed fin cooling system as set forth in claim 5, wherein the fan generates an air flow selected from the group consisting of a pull air flow and a push air flow.

7. The arrayed fin cooling system as set forth in claim 5, wherein the radial fin includes a seating surface for mounting the fan with the cooling fins.

8. The arrayed fin cooling system as set forth in claim 7 and further comprising:
- a lip extending outward of the outer edge and positioned below the seating surface of the radial fin;
- a fan mounting ring positioned adjacent to the lip; and
- a fastener for connecting the fan mounting ring with the fan and for urging the fan mounting ring into contact with the lip so that the fan is fixedly mounted on the seating surface.

9. The arrayed fin cooling system as set forth in claim 1, wherein a variation in the distance between the opposed cooling surfaces defines a cross-sectional profile selected from the group consisting of a sloped profile, a wedge profile, an equilateral triangle, and a right triangle.

10. The arrayed fin cooling system as set forth in claim 1, wherein an innermost of the cooling projections includes an inset portion adapted to receive at least one fastener and the fastener is connected with the inset portion and is operative to retain the cooling fins in fixed relation to one another.

11. The arrayed fin cooling system as set forth in claim 1, wherein the cooling projections are positioned within a predetermined radial distance from a selected one of the axis or the inner edge.

12. The arrayed fin cooling system as set forth in claim 11, wherein the predetermined radial distance is determined by a hub radius of a fan.

13. The arrayed fin cooling system as set forth in claim 1, wherein the first aerodynamically profiled surface and the second aerodynamically profiled surface have a profile that is a selected one or more of a sloped profile, an arcuate profile, and a planar profile.

14. The arrayed fin cooling system of claim 1, wherein heat is removed from the component by an air inflow through the air outlet, the radial shield channels the air inflow through the air path and over the cooling surfaces, the first aerodynamically profiled surface redirects a portion of the air inflow over the cooling projections, and the radial shield is operative to channel the air inflow into an air outflow that exits through the air inlet and along an axis that is substantially parallel with the inner edges.

15. The arrayed fin cooling system of claim 1, wherein the base ring comprises a first split ring and a second split ring that are connected with each other by at least one fastener and the first and second split rings are operative to clamp the cooling fins in fixed relation with one another.

16. The arrayed fin cooling system of claim 15 and further comprising
- a plurality of key profiles positioned on the first split ring and on the second split ring; and
- a base plate including a mounting surface, a base surface, and an aperture extending between the mounting and base surfaces and having a profile that complements the base ring, the aperture including a plurality of lock profiles that complement the key profiles, and
- wherein the base ring is mounted with the base plate by aligning the key profiles with the lock profiles and inserting the base ring through the aperture so that the second aerodynamically profiled surface is in contact with the mounting surface and then twisting the base ring to rotate the key profiles into engagement with the base surface to removably lock the base ring with the base plate.

17. The arrayed fin cooling system as set forth in claim 1, wherein the cooling fins are fixedly connected with one another using a process selected from the group consisting of welding and vacuum brazing.

* * * * *